(12) United States Patent
Lee et al.

(10) Patent No.: US 10,270,463 B2
(45) Date of Patent: *Apr. 23, 2019

(54) COMMUNICATION OF USER SPECIFIC CONTROL INFORMATION IN A WIRELESS NETWORK

(71) Applicant: NEWRACOM, INC., Irvine, CA (US)

(72) Inventors: Dae Won Lee, Irvine, CA (US); Yujin Noh, Irvine, CA (US); Sungho Moon, Irvine, CA (US); Young Hoon Kwon, Irvine, CA (US)

(73) Assignee: NEWRACOM, INC., Lake Forest, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/648,333

(22) Filed: Jul. 12, 2017

(65) Prior Publication Data

US 2017/0310339 A1    Oct. 26, 2017

Related U.S. Application Data

(63) Continuation of application No. 15/346,577, filed on Nov. 8, 2016, now Pat. No. 9,742,433.

(Continued)

(51) Int. Cl.
*H03M 13/00* (2006.01)
*H03M 7/30* (2006.01)
(Continued)

(52) U.S. Cl.
CPC ............ *H03M 7/30* (2013.01); *H04L 1/0059* (2013.01); *H04L 1/0061* (2013.01);
(Continued)

(58) Field of Classification Search
None
See application file for complete search history.

(56) References Cited

U.S. PATENT DOCUMENTS

| | | | |
|---|---|---|---|
| 2002/0138806 A1* | 9/2002 | Scalise | H03M 13/256 714/786 |
| 2003/0099217 A1* | 5/2003 | Castor | H03M 13/271 370/335 |

(Continued)

FOREIGN PATENT DOCUMENTS

WO    WO 2015/006640 A1    1/2015

OTHER PUBLICATIONS

"Part 11: Wireless LAN Medium Access Control (MAC) and Physical Layer (PHY) Specifications", IEEE Standards 802.11™ -2012 (Revision of IEEE Standard 802.11-2007), Mar. 29, 2012, pp. 1-2695, IEEE (The Institute of Electrical and Electronic Engineers, Inc.), New York, NY, USA.

(Continued)

*Primary Examiner* — Mujtaba M Chaudry

(57) ABSTRACT

A wireless device generates a High Efficiency Signal B (HE-SIG-B) field by Block Convolution Code (BCC) encoding and rate-matching a BCC block of the HE-SIG-B field, generates a Physical Layer Protocol Data Unit (PPDU) including the HE-SIG-B field, and transmits the PPDU. A total number N is a total number of bits of the HE-SIG-B field that precede the BCC block, and is greater than 0. The BCC block has a puncturing pattern depending on the total number N. A wireless device receives a PPDU. The PPDU includes an HE-SIG-B field that includes an encoded BCC block. The wireless device de-rate-matches the encoded BCC block having a puncturing pattern depending on a total number N. The total number N is a total number of decoded bits of the HE-SIG-B field that preceded the BCC block, and the total number N is greater than 0.

17 Claims, 13 Drawing Sheets

Related U.S. Application Data

(60) Provisional application No. 62/252,737, filed on Nov. 9, 2015, provisional application No. 62/263,482, filed on Dec. 4, 2015, provisional application No. 62/269,011, filed on Dec. 17, 2015, provisional application No. 62/269,686, filed on Dec. 18, 2015.

(51) Int. Cl.
*H04L 1/00* (2006.01)
*H04W 80/02* (2009.01)
*H04W 84/12* (2009.01)

(52) U.S. Cl.
CPC ........... *H04L 1/0069* (2013.01); *H04W 80/02* (2013.01); *H04L 1/0031* (2013.01); *H04W 84/12* (2013.01)

(56) References Cited

U.S. PATENT DOCUMENTS

| | | |
|---|---|---|
| 2014/0029681 A1 | 1/2014 | Zhang et al. |
| 2014/0079150 A1 | 3/2014 | Tong |
| 2014/0105187 A1* | 4/2014 | Das ........................ H04W 28/22 370/336 |
| 2016/0352362 A1* | 12/2016 | Fonseka ............ H03M 13/2906 |

OTHER PUBLICATIONS

"Part 11: Wireless LAN Medium Access Control (MAC) and Physical Layer (PHY) Specifications, Amendment 4: Enhancements for Very High Throughput for Operation in Bands below 6 GHz", IEEE Standards 802.11 ac™ -2013, 2013, pp. 1-395, IEEE (The Institute of Electrical and Electronic Engineers, Inc.), New York, NY, USA.

"Part 11: Wireless LAN Medium Access Control (MAC) and Physical Layer (PHY) Specifications, Amendment 2: Sub 1 GHz License Exempt Operation", IEEE P802.11ah™ /D5.0, Mar. 2015, pp. 1-604, IEEE (The Institute of Electrical and Electronic Engineers, Inc.), New York, NY, USA.

International Search Report and Written Opinion for PCT/US16/60957, filed Nov. 8, 2016.

* cited by examiner

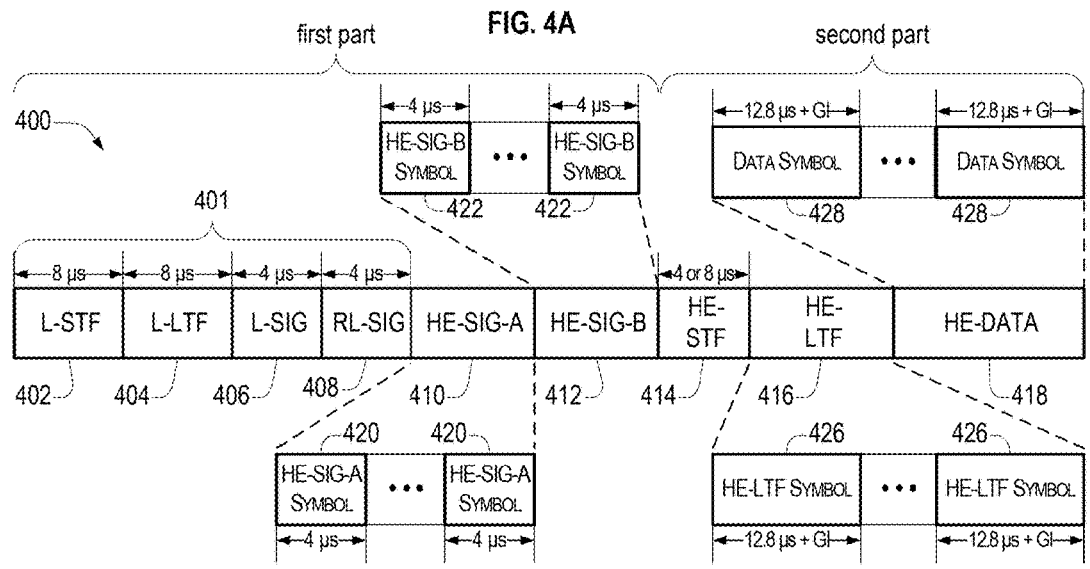

Table 1:

| Element | definition | duration | DFT period | GI | Subcarrier spacing |
|---|---|---|---|---|---|
| Legacy (L)-STF | Non-HT Short Training field | 8 μs | - | - | equiv. to 1,250 kHz |
| L-LTF | Non-HT Long Training field | 8 μs | 3.2 μs | 1.6 μs | 312.5 kHz |
| L-SIG | Non-HT Signal field | 4 μs | 3.2 μs | 0.8 μs | 312.5 kHz |
| RL-SIG | Repeated Non-HT SIGNAL field | 4 μs | 3.2 μs | 0.8 μs | 312.5 kHz |
| HE-SIG-A | HE SIGNAL A field | $N_{HESIGA}$ * 4 μs | 3.2 μs | 0.8 μs | 312.5 kHz |
| HE-SIG-B | HE SIGNAL B field | $N_{HESIGB}$ * 4 μs | 3.2 μs | 0.8 μs | 312.5 kHz |
| HE-STF | HE Short Training field | 4 or 8 μs | - | - | • non-trigger-based PPDU: (equiv. to) 1,250 kHz; • trigger-based PPDU: (equiv. to) 625 kHz |
| HE-LTF | HE Long Training field | $N_{HELTF}$ * (DFT period + GI)μs | 2xLTF: 6.4 μs 4xLTF: 12.8 μs | supports 0.8, 1.6, 3.2 μs | • 2xLTF: (equiv. to) 156.25 kHz; • 4xLTF: 78.125 kHz |
| HE-DATA | HE DATA field | $N_{DATA}$ * (DFT period + GI)μs | 12.8 μs | supports 0.8, 1.6, 3.2 μs | 78.125 kHz |

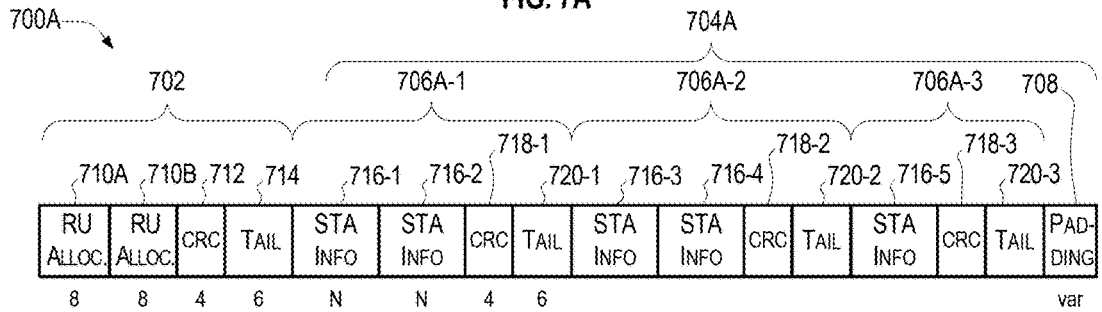
FIG. 7A
FIG. 7B
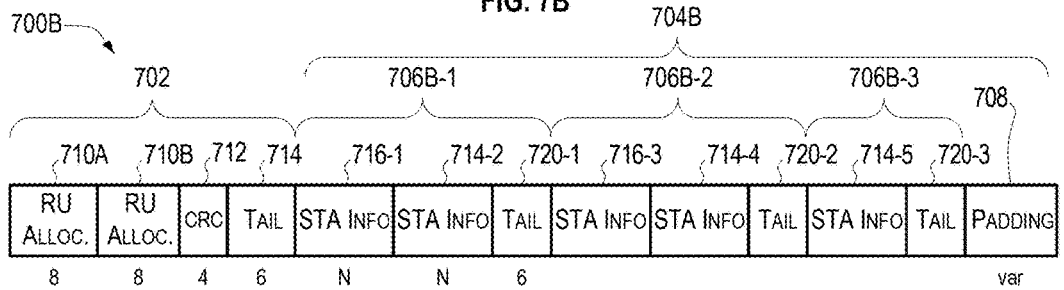
FIG. 8
Table 2
| MCS Index | Code-Rate | Modulation | $N_{RM}$ | $N_{SD}$ | $N_{CBPS}$ | $N_{DBPS}$ |
|---|---|---|---|---|---|---|
| 0 | 1/2 | BPSK | 1 | 52 | 52 | 26 |
| 1 | 1/2 | QPSK | 1 | 52 | 104 | 52 |
| 2 | 3/4 | QPSK | 3 | 52 | 104 | 78 |
| 3 | 1/2 | 16 QAM | 1 | 52 | 208 | 104 |
| 4 | 3/4 | 16 QAM | 3 | 52 | 208 | 156 |
| 5 | 2/3 | 64 QAM | 2 | 52 | 312 | 208 |
| 6 | 3/4 | 64 QAM | 3 | 52 | 312 | 234 |
| 7 | 5/6 | 64 QAM | 5 | 52 | 312 | 260 |
| 8 | 3/4 | 256 QAM | 3 | 52 | 416 | 312 |
| 9 | 5/6 | 256 QAM | 5 | 52 | 416 | 346* |

COMMUNICATION OF USER SPECIFIC CONTROL INFORMATION IN A WIRELESS NETWORK

CROSS-REFERENCE TO RELATED APPLICATION

This application is a continuation of U.S. patent application Ser. No. 15/346,577, filed Nov. 8, 2016, now U.S. Pat. No. 9,742,433, issued Aug. 22, 2017, which claims the benefit of U.S. Provisional Patent Application No. 62/252,737, filed Nov. 9, 2015, U.S. Provisional Patent Application No. 62/263,482, filed Dec. 4, 2015, U.S. Provisional Patent Application No. 62/269,011, filed Dec. 17, 2015, and U.S. Provisional Patent Application No. 62/269,686, filed Dec. 18, 2015, which are incorporated by reference herein in their entireties.

BACKGROUND

1. Technical Field

The technology described herein relates generally to wireless networking. More particularly, the technology relates to the communication of user specific control information in a wireless local area network (WLAN), including coding of the user specific control information.

2. Description of the Related Art

Wireless LAN (WLAN) devices are currently being deployed in diverse environments. Some of these environments have large numbers of access points (APs) and non-AP stations in geographically limited areas. In addition, WLAN devices are increasingly required to support a variety of applications such as video, cloud access, and offloading. In particular, video traffic is expected to be the dominant type of traffic in many high efficiency WLAN deployments. With the real-time requirements of some of these applications, WLAN users demand improved performance in delivering their applications, including improved power consumption for battery-operated devices.

A WLAN is being standardized by the IEEE (Institute of Electrical and Electronics Engineers) Part 11 under the name of "Wireless LAN Medium Access Control (MAC) and Physical Layer (PHY) Specifications." A series of standards have been adopted as the WLAN evolved, including IEEE Std 802.11™-2012 (March 2012) (IEEE 802.11n). The IEEE Std 802.11 was subsequently amended by IEEE Std 802.11ae™-2012, IEEE Std 802.11aa™-2012, IEEE Std 802.11ad™-2012, and IEEE Std 802.11ac™-2013 (IEEE 802.11ac).

Recently, an amendment focused on providing a High Efficiency (HE) WLAN in high-density scenarios is being developed by the IEEE 802.11ax task group. The 802.11ax amendment focuses on improving metrics that reflect user experience, such as average per station throughput, the 5th percentile of per station throughput of a group of stations, and area throughput. Improvements may be made to support environments such as wireless corporate offices, outdoor hotspots, dense residential apartments, and stadiums.

A Physical Layer Protocol Data Unit (PPDU) transmitted in an HE WLAN may include user specific control information in an HE Signal B (HE-SIG-B) field. To reduce overhead in the HE WLAN, efficient encoding the information in the HE-SIG-B field may be used.

The HE-SIG-B field is encoding using one of a 1/2, 2/3, 3/4, and 5/6 coding rate. That is, for each bit in the HE-SIG-B field, an average of 2, 1.5, 1.333, or 1.2 bits are encoded for transmission. The bits to be encoded may be generated by producing 2×N bits from N bits of the HE-SIG-B field and then removing some of the 2×N bits. For example, a 3/4 bit rate may be generated by generating 6 bits from each 3 bits of the HE-SIG-B field and then removing two of each of the generated 6 bits, and a 5/6 bit rate may be generated by generating 10 bits from each 5 bits of the HE-SIG-B field and then removing four of each of the generated 10 bits. This process is known as rate matching, and the removal of bits may be referred to as puncturing. Generally, the puncturing is done according to a pattern (a puncturing pattern) determined by the coding rate.

Depending on the coding rate chosen, subfields of the HE-SIG-B field may not start at boundary used by to perform rate matching.

SUMMARY

In an embodiment, a method performed by a wireless device comprises generating a High Efficiency Signal B (HE-SIG-B) field by Block Convolution Code (BCC) encoding and rate-matching a BCC block of the HE-SIG-B field, generating a Physical Layer Protocol Data Unit (PPDU) including the HE-SIG-B field, and transmitting the PPDU. A total number N is a total number of bits of the HE-SIG-B field that precede the BCC block, the total number N is greater than 0, and the BCC block has a puncturing pattern depending on the total number N.

In an embodiment, the BCC block has a code-rate of K/M, K and M being positive integers greater than zero, so that K bits of the BCC block are encoded into M bits. The puncturing pattern depends on a remainder Z. The remainder Z is equal to the total number N modulo K.

In an embodiment, the puncturing pattern is equal to a basic puncturing pattern for the code-rate K/M left cyclic-shifted by the remainder Z.

In an embodiment, BCC encoding the BCC block includes generating a first set of encoded bits using a first polynomial, and generating a second set of encoded bits using a second polynomial.

In an embodiment, the code-rate is 3/4, the first set of encoded bits includes a first plurality of consecutive three-bit sequences beginning at an earliest bit of the first set, and the second set of encoded bits includes a second plurality of consecutive three-bit sequences beginning at an earliest bit of the second set. Rate-matching the BCC block includes: i) discarding third bits of each of the first plurality of consecutive three-bit sequences and second bits of each of the second plurality of consecutive three-bit sequences when the remainder Z is equal to zero, ii) discarding second bits of each of the first plurality of consecutive three-bit sequences of the first set of encoded bits and first bits of each of the second plurality of consecutive three-bit sequences when the remainder Z is equal to one, and iii) discarding first bits of each of the first plurality of consecutive three-bit sequences and thirds bit of each of the second plurality of consecutive three-bit sequences when the remainder Z is equal to two.

In an embodiment, the code-rate is 2/3, and the second set of encoded bits includes a plurality of consecutive two-bit sequences beginning at an earliest bit of the second set. Rate-matching the BCC block includes: i) discarding second bits of each of the plurality of consecutive two-bit sequences when the remainder Z is equal to zero, and ii) discarding first bits of each of the plurality of consecutive two-bit sequences when the remainder Z is equal to one.

In an embodiment, the code-rate is 5/6, the first set of encoded bits includes a first plurality of consecutive five-bit sequences beginning at an earliest bit of the first set, and the second set of encoded bits includes a second plurality of consecutive five-bit sequences beginning at an earliest bit of the second set. Rate rate-matching the BCC block includes: i) discarding third and fifth bits of each of the first plurality of consecutive five-bit sequences and second and fourth bits of each of the second plurality of consecutive five-bit sequences when the remainder Z is equal to zero, ii) discarding second and fourth bits of each of the first plurality of consecutive five-bit sequences and first and third bits of each of the second plurality of consecutive five-bit sequences when the remainder Z is equal to one, iii) discarding first and third bits of each of the first plurality of consecutive five-bit sequences and second and fifth bits of each of the second plurality of consecutive five-bit sequences when the remainder Z is equal to two, iv) discarding second and fifth bits of each of the first plurality of consecutive five-bit sequences and first and fourth bits of each of the second plurality of consecutive five-bit sequences when the remainder Z is equal to three, and v) discarding first and fourth bits of each of the first plurality of consecutive five-bit sequences and third and fifth bits of each of the second plurality of consecutive five-bit sequences when the remainder Z is equal to four.

In an embodiment, the HE-SIG-B field includes a plurality of BCC blocks, and the method further comprises BCC encoding a plurality of BCC blocks of the HE-SIG-B field as a single codeword.

In an embodiment, the HE-SIG-B field includes a plurality of BCC blocks, and a plurality of total numbers N are respective total numbers of bits of the HE-SIG-B field that respectively precede the respective BCC blocks of the plurality of BCC blocks. The method further comprises separately rate-matching the BCC blocks of the plurality of BCC blocks using respective puncturing patterns determined using the respective total numbers N.

In an embodiment, the BCC block corresponds to a per-station (per-STA) information field. The per-STA information field includes information for one or two stations.

In an embodiment, a method performed by a wireless device comprises receiving a Physical Layer Protocol Data Unit (PPDU). The PPDU includes a High Efficiency Signal B (HE-SIG-B) field that includes an encoded Block Convolution Code (BCC) block. The method further comprises de-rate-matching the encoded BCC block having a puncturing pattern depending on a total number N. The total number N is a total number of decoded bits of the HE-SIG-B field that preceded the BCC block, and the total number N is greater than 0.

In an embodiment, the BCC block has a code-rate of K/M, K and M being positive integers greater than zero, so that K bits of the BCC block are encoded into M bits, and the puncturing pattern depends on a remainder Z, the remainder Z being equal to the total number N modulo K.

In an embodiment, the puncturing pattern is equal to a basic puncturing pattern for the code-rate K/M left cyclic-shifted by the remainder Z.

In an embodiment, the code-rate is 3/4, and de-rate-matching the encoded BCC block includes, for each of a plurality of consecutive four-value sequence {x1, x2, x3, x4} in the encoded BCC block: i) generating a first three-value sequence {x1, x3, D} and a second three-value sequence {x2, D, x4} when the remainder Z is equal to zero;

ii) generating the first three-value sequence {x1, D, x3} and the second three-value sequence {D, x2, x4} when the remainder Z is equal to one; and iii) generating the first three-value sequence {D, x2, x4} and the second three-value sequence {x1, x3, D} when the remainder Z is equal to two. D is a predetermined dummy value.

In an embodiment, the code-rate is 2/3, and de-rate-matching the encoded BCC block includes, for each of a plurality of consecutive three-value sequence {x1, x2, x3} in the encoded BCC block: i) generating a first two-value sequence {x1, x3} and a second two-value sequence {x2, D} when the remainder Z is equal to zero; and ii) generating the first two-value sequence {x1, x2} and the second two-value sequence {D, x3} when the remainder Z is equal to one. D is a predetermined dummy value.

In an embodiment, the code-rate is 5/6, and de-rate-matching the encoded BCC block includes, for each of a plurality of consecutive six-value sequence {x1, x2, x3, x4, x5, x6} in the encoded BCC block: i) generating a first five-value sequence {x1, x3, D, x6, D} and a second five-value sequence {x2, D, x4, D, x6} when the remainder Z is equal to zero; ii) generating the first five-value sequence {x1, D, x3, D, x5} and the second five-value sequence {D, x2, D, x4, x6} when the remainder Z is equal to one; iii) generating the first five-value sequence {D, x2, D, x4, x6} and the second five-value sequence {x1, D, x3, x5, D} when the remainder Z is equal to two; iv) generating the first five-value sequence {x1, D, x3, x5, D} and the second five-value sequence {D, x2, x4, D, x6} when the remainder Z is equal to three; and v) generating the first five-value sequence {D, x2, x4, D, x6} and the second five-value sequence {x1, x3, D, x5, D} when the remainder Z is equal to four. D is a predetermined dummy value.

In an embodiment, the HE-SIG-B field includes a plurality of BCC blocks, and the encoded HE-SIG-B field includes a plurality of portions respectively corresponding to the plurality of BCC blocks. The method further comprises de-rate-matching the plurality of portions as a single codeword.

In an embodiment, the HE-SIG-B field includes a plurality of BCC blocks, the encoded HE-SIG-B field includes a plurality of portions respectively corresponding to the plurality of BCC blocks, and a plurality of total numbers N are respective total numbers of bits of the HE-SIG-B field that respectively precede the respective BCC blocks of the plurality of BCC blocks. The method further comprises separately de-rate-matching the portions of the encoded HE-SIG-B field according to respective puncturing patterns determined according to the respective total numbers N.

In an embodiment, the BCC block corresponds to a per-station (per-STA) information field. The per-STA information field includes information for one or two stations.

BRIEF DESCRIPTION OF THE DRAWINGS

FIG. 4A illustrates an HE Physical Layer Protocol Data Unit (PPDU), according to an embodiment.

FIG. 4B shows a Table 1 disclosing additional properties of fields of the HE PPDU frame of FIG. 4A, according to an embodiment.

FIG. 7A illustrates an HE-SIG-B field, according to an embodiment.

FIG. 7B illustrates an HE-SIG-B field, according to another embodiment.

FIG. 8 show a table listing modulation, code-rates, and other characteristics for each of a plurality of Modulation and Coding Scheme (MCS) indexes.

DETAILED DESCRIPTION

Figure 1:
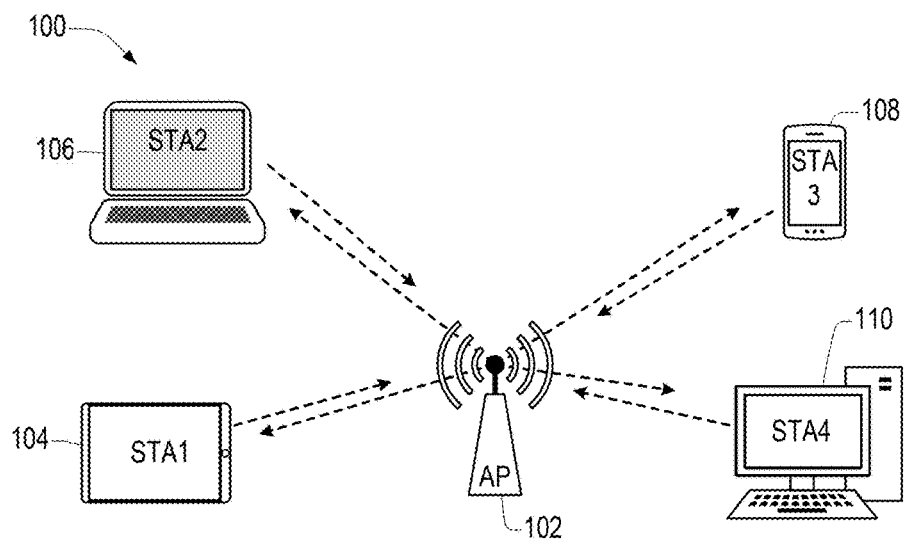
FIG. 1 illustrates a wireless network, according to an embodiment.

The technology described herein relates generally to wireless networking. More particularly, the technology relates to techniques for encoding and decoding a High-Efficiency Signal B (HE-SIG-B) field.

In the following detailed description, certain illustrative embodiments have been illustrated and described. As those skilled in the art would realize, these embodiments are capable of modification in various different ways without departing from the scope of the present disclosure. Accordingly, the drawings and description are to be regarded as illustrative in nature and not restrictive. Like reference numerals designate like elements in the specification.

FIG. 1 illustrates a wireless network according to an embodiment. The wireless network includes an infrastructure Basic Service Set (BSS) 100 of a Wireless Local Area Network (WLAN). In an 802.11 wireless LAN (WLAN), the BSS provides the basic organizational unit and typically includes an Access Point (AP) and one or more associated stations (STAs). In FIG. 1, the BSS 100 includes an Access Point 102 (also referred to as the AP) wirelessly communicating with first, second, third, and fourth wireless devices (or stations) 104, 106, 108, and 110 (also referred to as stations STA1, STA2, STA3, and STA4, respectively). The wireless devices may each include a medium access control layer (MAC) and a physical layer (PHY) according to an IEEE 802.11 standard.

Although FIG. 1 shows the BSS 100 including only the first to fourth stations STA1 to STA4, embodiments are not limited thereto and may comprise BSSs including any number of stations.

The AP 102 is a station, that is, a STA, configured to control and coordinate functions of the BSS 100. The AP 102 may transmit information to a single station selected from the plurality of stations STA1 to STA4 in the BSS 100 using a single frame, or may simultaneously transmit information to two or more of the stations STA1 to STA4 in the BSS 100 using either a single Orthogonal Frequency Division Multiplexing (OFDM) broadcast frame, a single OFDM Multi-User Multi-Input-Multi-Output (MU-MIMO) transmission, a single Orthogonal Frequency Division Multiple Access (OFDMA) frame, or a single MU-MIMO OFDMA frame.

The stations STA1 to STA4 may each transmit data to the AP 102 using a single frame, or transmit information to and receive information from each other using a single frame. Two or more of the stations STA1 to STA4 may simultaneously transmit data to the AP 102 using an Uplink (UL) OFDMA frame, an UL MU-MIMO frame, or an UL MU-MIMO OFDMA frame.

In another embodiment, the AP 102 may be absent and the stations STA1 to STA4 may be in an ad-hoc network.

Each of the stations STA1 to STA4 and the AP 102 includes a processor and a transceiver, and may further include a user interface and a display device.

The processor is configured to generate a frame to be transmitted through a wireless network, to process a frame received through the wireless network, and to execute protocols of the wireless network. The processor may perform some or all of its functions by executing computer programming instructions stored on a non-transitory computer-readable medium.

The transceiver represents a unit functionally connected to the processor, and designed to transmit and receive a frame through the wireless network. The transceiver may include a single component that performs the functions of transmitting and receiving, or two separate components each performing one of such functions.

The processor and transceiver of the stations STA1 to STA4 and the AP 102 may be respectively implemented using hardware components, software components, or both.

The AP 102 may be or may include a WLAN router, a stand-alone Access Point, a WLAN bridge, a Light-Weight Access Point (LWAP) managed by a WLAN controller, and the like. In addition, a device such as a personal computer, tablet computer, or cellular phone may configured able to operate as the AP 102, such as when a cellular phone is configured to operate as a wireless "hot spot."

Each of the stations STA1 to STA4 may be or may include a desktop computer, a laptop computer, a tablet PC, a wireless phone, a mobile phone, a smart phone, an e-book reader, a Portable Multimedia Player (PMP), a portable game console, a navigation system, a digital camera, a Digital Multimedia Broadcasting (DMB) player, a digital audio recorder, a digital audio player, a digital picture recorder, a digital picture player, a digital video recorder, a digital video player, and the like.

The present disclosure may be applied to WLAN systems according to IEEE 802.11 standards but embodiments are not limited thereto.

In IEEE 802.11 standards, frames exchanged between stations (including access points) are classified into management frames, control frames, and data frames. A management frame may be a frame used for exchanging management information that is not forwarded to a higher layer of a communication protocol stack. A control frame may be a frame used for controlling access to a medium. A data frame may be a frame used for transmitting data to be forwarded to the higher layer of the communication protocol stack.

A type and subtype of a frame may be identified using a type field and a subtype field included in a control field of the frame, as prescribed in the applicable standard.

Figure 2:
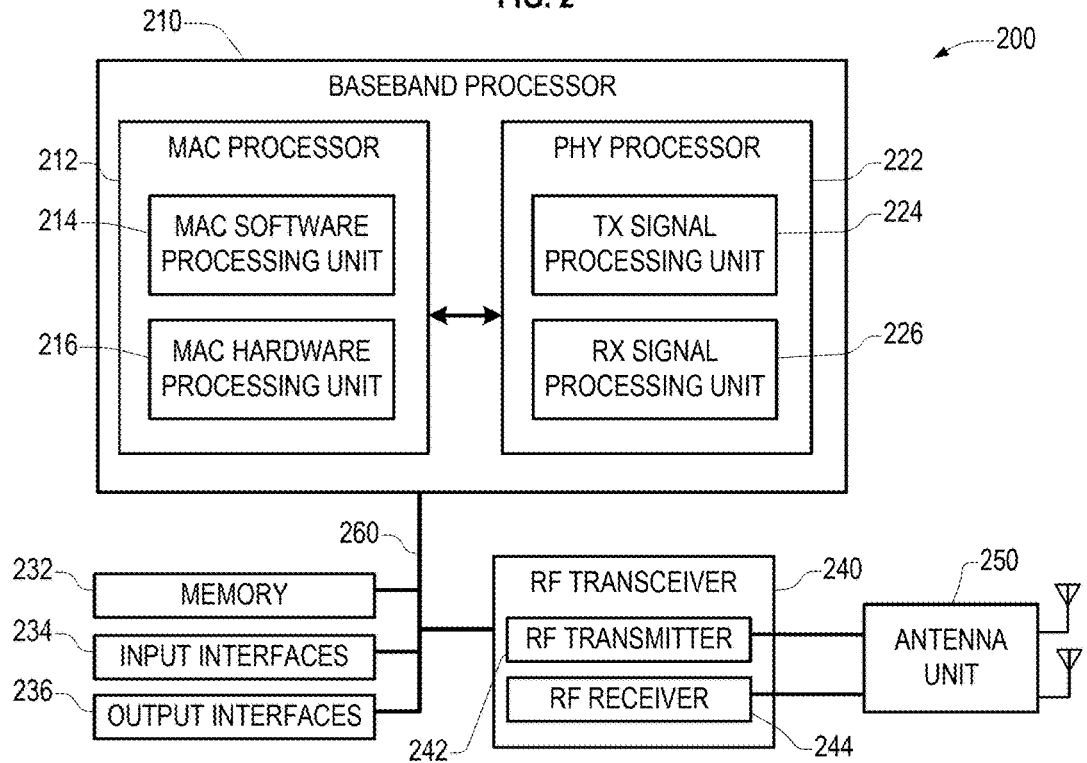
FIG. 2 is a schematic diagram of a wireless device, according to an embodiment.

FIG. 2 illustrates a schematic block diagram of a wireless device 200 according to an embodiment. The wireless or WLAN device 200 may be included in the AP 102 or any of the stations STA1 to STA4 in FIG. 1. The WLAN device 200 includes a baseband processor 210, a radio frequency (RF) transceiver 240, an antenna unit 250, a storage device (e.g., memory) 232, one or more input interfaces 234, and one or more output interfaces 236. The baseband processor 210, the memory 232, the input interfaces 234, the output interfaces 236, and the RF transceiver 240 may communicate with each other via a bus 260.

The baseband processor 210 performs baseband signal processing, and includes a MAC processor 212 and a PHY processor 222. The baseband processor 210 may utilize the memory 232, which may include a non-transitory computer readable medium having software (e.g., computer programming instructions) and data stored therein.

In an embodiment, the MAC processor 212 includes a MAC software processing unit 214 and a MAC hardware processing unit 216. The MAC software processing unit 214 may implement a first plurality of functions of the MAC layer by executing MAC software, which may be included in the software stored in the memory 232. The MAC hardware processing unit 216 may implement a second plurality of functions of the MAC layer in special-purpose hardware. However, the MAC processor 212 is not limited thereto. For example, the MAC processor 212 may be configured to perform the first and second plurality of functions entirely in software or entirely in hardware according to an implementation.

The PHY processor 222 includes a transmitting signal processing unit (SPU) 224 and a receiving SPU 226. The PHY processor 222 implements a plurality of functions of the PHY layer. These functions may be performed in software, hardware, or a combination thereof according to an implementation.

Functions performed by the transmitting SPU 224 may include one or more of Forward Error Correction (FEC) encoding, stream parsing into one or more spatial streams, diversity encoding of the spatial streams into a plurality of space-time streams, spatial mapping of the space-time streams to transmit chains, inverse Fourier Transform (iFT) computation, Cyclic Prefix (CP) insertion to create a Guard Interval (GI), and the like. Functions performed by the receiving SPU 226 may include inverses of the functions performed by the transmitting SPU 224, such as GI removal, Fourier Transform computation, and the like.

The RF transceiver 240 includes an RF transmitter 242 and an RF receiver 244. The RF transceiver 240 is configured to transmit first information received from the baseband processor 210 to the WLAN, and provide second information received from the WLAN to the baseband processor 210.

The antenna unit 250 includes one or more antennas. When Multiple-Input Multiple-Output (MIMO) or Multi-User MIMO (MU-MIMO) is used, the antenna unit 250 may include a plurality of antennas. In an embodiment, the antennas in the antenna unit 250 may operate as a beamformed antenna array. In an embodiment, the antennas in the antenna unit 250 may be directional antennas, which may be fixed or steerable.

The input interfaces 234 receive information from a user, and the output interfaces 236 output information to the user. The input interfaces 234 may include one or more of a keyboard, keypad, mouse, touchscreen, microphone, and the like. The output interfaces 236 may include one or more of a display device, touch screen, speaker, and the like.

As described herein, many functions of the WLAN device 200 may be implemented in either hardware or software. Which functions are implemented in software and which functions are implemented in hardware will vary according to constraints imposed on a design. The constraints may include one or more of design cost, manufacturing cost, time to market, power consumption, available semiconductor technology, and so on.

As described herein, a wide variety of electronic devices, circuits, firmware, software, and combinations thereof may be used to implement the functions of the components of the WLAN device 200. Furthermore, the WLAN device 200 may include other components, such as application processors, storage interfaces, clock generator circuits, power supply circuits, and the like, which have been omitted in the interest of brevity.

Figure 3A:
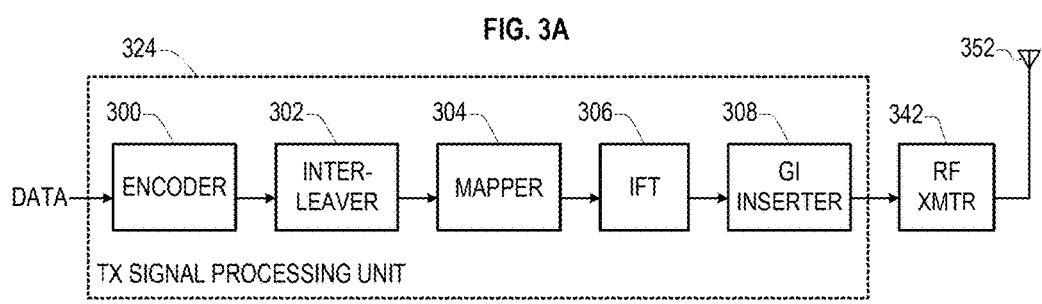
FIG. 3A illustrates components of a wireless device configured to transmit data, according to an embodiment.

FIG. 3A illustrates components of a wireless device configured to transmit data according to an embodiment, including a Transmitting (Tx) SPU (TxSP) 324, an RF transmitter 342, and an antenna 352. In an embodiment, the TxSP 324, the RF transmitter 342, and the antenna 352 correspond to the transmitting SPU 224, the RF transmitter 242, and an antenna of the antenna unit 250 of FIG. 2, respectively.

The TxSP 324 includes an encoder 300, an interleaver 302, a mapper 304, an inverse Fourier transformer (IFT) 306, and a guard interval (GI) inserter 308.

The encoder 300 receives and encodes input data DATA. In an embodiment, the encoder 300 includes a forward error correction (FEC) encoder. The FEC encoder may include a binary convolutional code (BCC) encoder followed by a puncturing device. The FEC encoder may include a low-density parity-check (LDPC) encoder.

The TxSP 324 may further include a scrambler for scrambling the input data before the encoding is performed by the encoder 300 to reduce the probability of long sequences of 0s or 1s. When the encoder 300 performs the BCC encoding, the TxSP 324 may further include an encoder parser for demultiplexing the scrambled bits among a plurality of BCC encoders. If LDPC encoding is used in the encoder, the TxSP 324 may not use the encoder parser.

The interleaver 302 interleaves the bits of each stream output from the encoder 300 to change an order of bits therein. The interleaver 302 may apply the interleaving only when the encoder 300 performs the BCC encoding, and otherwise may output the stream output from the encoder 300 without changing the order of the bits therein.

The mapper 304 maps the sequence of bits output from the interleaver 302 to constellation points. If the encoder 300 performed LDPC encoding, the mapper 304 may also perform LDPC tone mapping in addition to the constellation mapping.

When the TxSP 324 performs a MIMO or MU-MIMO transmission, the TxSP 324 may include a plurality of interleavers 302 and a plurality of mappers 304 according to a number of spatial streams (NSS) of the transmission. The TxSP 324 may further include a stream parser for dividing the output of the encoder 300 into blocks and may respectively send the blocks to different interleavers 302 or mappers 304. The TxSP 324 may further include a space-time block code (STBC) encoder for spreading the constellation points from the spatial streams into a number of space-time streams (NSTS) and a spatial mapper for mapping the space-time streams to transmit chains. The spatial mapper may use direct mapping, spatial expansion, or beamforming.

The IFT 306 converts a block of the constellation points output from the mapper 304 (or, when MIMO or MU-MIMO is performed, the spatial mapper) to a time domain block (i.e., a symbol) by using an inverse discrete Fourier transform (IDFT) or an inverse fast Fourier transform (IFFT). If the STBC encoder and the spatial mapper are used, the IFT 306 may be provided for each transmit chain.

When the TxSP 324 performs a MIMO or MU-MIMO transmission, the TxSP 324 may insert cyclic shift diversities (CSDs) to prevent unintentional beamforming. The TxSP 324 may perform the insertion of the CSD before or after the IFT 306. The CSD may be specified per transmit chain or may be specified per space-time stream. Alternatively, the CSD may be applied as a part of the spatial mapper.

When the TxSP 324 performs a MIMO or MU-MIMO transmission, some blocks before the spatial mapper may be provided for each user.

The GI inserter 308 prepends a GI to each symbol produced by the IFT 306. Each GI may include a Cyclic Prefix (CP) corresponding to a repeated portion of the end of the symbol that the GI precedes. The TxSP 324 may optionally perform windowing to smooth edges of each symbol after inserting the GI.

The RF transmitter 342 converts the symbols into an RF signal and transmits the RF signal via the antenna 352. When the TxSP 324 performs a MIMO or MU-MIMO transmission, the GI inserter 308 and the RF transmitter 342 may be provided for each transmit chain.

Figure 3B:
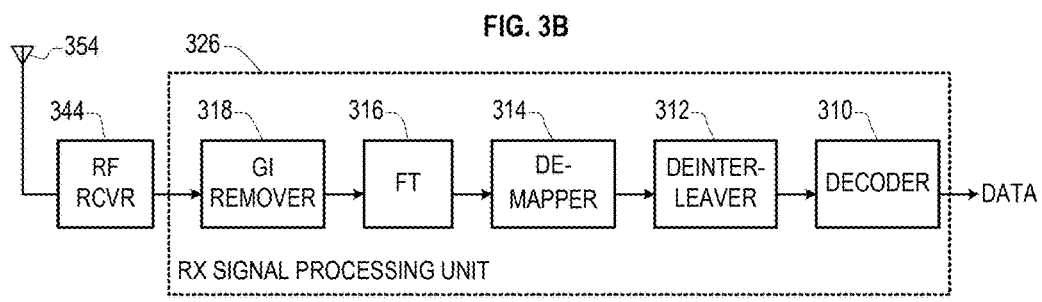
FIG. 3B illustrates components of a wireless device configured to receive data, according to an embodiment.

FIG. 3B illustrates components of a wireless device configured to receive data according to an embodiment, including a Receiver (Rx) SPU (RxSP) 326, an RF receiver 344, and an antenna 354. In an embodiment, the RxSP 326, RF receiver 344, and antenna 354 may correspond to the receiving SPU 226, the RF receiver 244, and an antenna of the antenna unit 250 of FIG. 2, respectively.

The RxSP 326 includes a GI remover 318, a Fourier transformer (FT) 316, a demapper 314, a deinterleaver 312, and a decoder 310.

The RF receiver 344 receives an RF signal via the antenna 354 and converts the RF signal into symbols. The GI remover 318 removes the GI from each of the symbols. When the received transmission is a MIMO or MU-MIMO transmission, the RF receiver 344 and the GI remover 318 may be provided for each receive chain.

The FT 316 converts each symbol (that is, each time domain block) into a frequency domain block of constellation points by using a discrete Fourier transform (DFT) or a fast Fourier transform (FFT). The FT 316 may be provided for each receive chain.

When the received transmission is the MIMO or MU-MIMO transmission, the RxSP 326 may include a spatial demapper for converting the respective outputs of the FTs 316 of the receiver chains to constellation points of a plurality of space-time streams, and an STBC decoder for despreading the constellation points from the space-time streams into one or more spatial streams.

The demapper 314 demaps the constellation points output from the FT 316 or the STBC decoder to bit streams. If the received transmission was encoded using the LDPC encoding, the demapper 314 may further perform LDPC tone demapping before performing the constellation demapping.

The deinterleaver 312 deinterleaves the bits of each stream output from the demapper 314. The deinterleaver 312 may perform the deinterleaving only when the received transmission was encoded using the BCC encoding, and otherwise may output the stream output by the demapper 314 without performing deinterleaving.

When the received transmission is the MIMO or MU-MIMO transmission, the RxSP 326 may use a plurality of demappers 314 and a plurality of deinterleavers 312 corresponding to the number of spatial streams of the transmission. In this case, the RxSP 326 may further include a stream deparser for combining the streams output from the deinterleavers 312.

The decoder 310 decodes the streams output from the deinterleaver 312 or the stream deparser. In an embodiment, the decoder 312 includes an FEC decoder. The FEC decoder may include a BCC decoder or an LDPC decoder.

The RxSP 326 may further include a descrambler for descrambling the decoded data. When the decoder 310 performs the BCC decoding, the RxSP 326 may further include an encoder deparser for multiplexing the data decoded by a plurality of BCC decoders. When the decoder 310 performs the LDPC decoding, the RxSP 326 may not use the encoder deparser.

Before making a transmission, wireless devices such as wireless device 200 will assess the availability of the wireless medium using Clear Channel Assessment (CCA). If the medium is occupied, CCA may determine that it is busy, while if the medium is available, CCA determines that it is idle.

The PHY entity for IEEE Std 802.11 is based on Orthogonal Frequency Division Multiplexing (OFDM) or Orthogonal Frequency Division Multiple Access (OFDMA). In either OFDM or OFDMA Physical (PHY) layers, a STA is capable of transmitting and receiving Physical Layer Protocol Data Units (PPDUs) that are compliant with the mandatory PHY specifications. A PHY specification defines a set of Modulation and Coding Schemes (MCS) and a maximum number of spatial streams. Some PHY entities define downlink (DL) and uplink (UL) Multi-User (MU) transmissions having a maximum number of space-time streams (STS) per user and employing up to a predetermined total number of STSs.

A PHY entity may define PPDUs that are individually addressed using an Association Identifier (AID) or Partial AID and may also define PPDUs that are group addressed based on Group ID (GID).

A PHY entity may provide support for 20 MHz, 40 MHz, 80 MHz, and 160 MHz contiguous channel widths and support for an 80+80 MHz non-contiguous channel width. Each channel includes a plurality of subcarriers, which may also be referred to as tones. Data subcarriers within the channels may be modulated using binary phase shift keying (BPSK), quadrature phase shift keying (QPSK), 16-quadrature amplitude modulation (16-QAM), 64-QAM, and 256-QAM. Forward error correction (FEC) coding (such as convolutional or Low Density Parity Check (LDPC) coding) may be used with coding rates of 1/2, 2/3, 3/4 and 5/6.

A PHY entity may define fields denoted as Legacy Signal (L-SIG), Signal A (SIG-A), and Signal B (SIG-B) within which some necessary information about PHY Service Data Unit (PSDU) attributes are communicated. For example, a High Efficiency (HE) PHY entity may define an L-SIG field, an HE-SIG-A field, and an HE-SIG-B field. In an embodiment, the symbols in the L-SIG, SIG-A, and SIG-B fields are encoded with the most robust (and therefore least efficient) MCS of the PHY entity.

To prevent excessive consumption of WLAN resource by overhead, the L-SIG, HE-SIG-A, and HE-SIG-B fields have a limited number of bits and it is advantageous to encode them in the most compact form possible. In a receiving STA, the symbols of these fields are decoded first in order to obtain vital information about the PSDU attributes and some MAC attributes.

In the IEEE Std 802.11ac, SIG-A and SIG-B fields are called VHT SIG-A and VHT SIG-B fields. Hereinafter, IEEE Std 802.11ax SIG-A and SIG-B fields are respectively referred to as HE-SIG-A and HE-SIG-B fields.

FIG. 4A illustrates an HE PPDU 400 according to an embodiment. A transmitting station generates the HE PPDU frame 400 and transmits it to one or more receiving stations. The receiving stations receive, detect, and process the HE PPDU frame 400.

The HE PPDU frame 400 includes a Legacy Short Training Field (L-STF) field 402, a Legacy (i.e., a Non-High Throughput (Non-HT)) Long Training Field (L-LTF) 404, a Legacy Signal (L-SIG) field 406, and a Repeated L-SIG field (RL-SIG) 408, which together comprise a legacy preamble 401. The L-STF 404 of a non-trigger-based PPDU has a periodicity of 0.8 μs with 10 periods.

The HE PPDU frame 400 also includes an HE-SIG-A field 410, an optional HE-SIG-B field 412, an HE-STF 414, an HE-LTF 416, and an HE-Data field 418.

The legacy preamble 401, the HE-SIG-A field 410, and the HE-SIG-B field 412 when present, comprise a first part of the HE PPDU frame 400. In an embodiment, the first part of the HE PPDU frame 400 is decoded using a 64-element Discrete Fourier Transform (DFT), having a basic subcarrier spacing of 312.5 KHz.

The HE-SIG-A field 410 is duplicated on each 20 MHz segment after the legacy preamble to indicate common control information. The HE-SIG-A field 410 includes a plurality of OFDM HE-SIG-A symbols 420 each having a duration (including a Guard Interval (GI)) of 4 μs. A number of the HE-SIG-A symbols 420 in the HE-SIG-A field 410 is indicated by $N_{HESIGA}$ and is either 2 or 4.

The HE-SIG-B field 412 is included in Down-Link (DL) Multi-User (MU) PPDUs. The HE-SIG-B field 412 includes a plurality of OFDM HE-SIG-B symbols 422 each having a duration including a Guard Interval (GI) of 4 μs. In embodiments, Single User (SU) PPDUs, Up-Link (UL) MU PPDUs, or both do not include the HE-SIG-B field 412. A number of the HE-SIG-B symbols 422 in the HE-SIG-B field 412 is indicated by $N_{HESIGB}$ and is variable.

When the HE PPDU 400 has a bandwidth of 40 MHz or more, the HE-SIG-B field 412 may be transmitted in first and second HE-SIG-B channels 1 and 2. The HE-SIG-B field in the HE-SIG-B channel 1 is referred to as the RE-SIG-B1 field, and the HE-SIG-B field in the HE-SIG-B channel 2 is referred to as the HE-SIG-B2 field. The RE-SIG-B1 field and the HE-SIG-B2 field are communicated using different 20 MHz bandwidths of the HE PPDU 400, and may contain different information. Within this document, the term "HE-SIG-B field" may refer to an HE-SIG-B field of a 20 MHz PPDU, or to either of an HE-SIG-B1 field or HE-SIG-B2 field of a 40 MHz or more PPDU.

An HE-STF 414 of a non-trigger-based PPDU has a periodicity of 0.8 μs with 5 periods. A non-trigger-based PPDU is a PPDU that is not sent in response to a trigger frame. An HE-STF 414 of a trigger-based PPDU has a periodicity of 1.6 μs with 5 periods. Trigger-based PPDUs include UL PPDUs sent in response to respective trigger frames.

The HE-LTF 416 includes one or more OFDM HE-LTF symbols 426 each having a duration of 12.8 μs plus a Guard Interval (GI). The HE PPDU frame 400 may support a 2×LTF mode and a 4×LTF mode. In the 2×LTF mode, an HE-LTF symbol 426 excluding a Guard Interval (GI) is equivalent to modulating every other tone in an OFDM symbol of 12.8 μs excluding the GI, and then removing the second half of the OFDM symbol in a time domain. A number of the HE-LTF symbols 426 in the HE-LTF field 416 is indicated by $N_{HELTF}$, and is equal to 1, 2, 4, 6, or 8.

The HE-Data field 418 includes one or more OFDM HE-Data symbols 428 each having a duration of 12.8 μs plus a Guard Interval (GI). A number of the HE-Data symbols 428 in the HE-Data field 418 is indicated by $N_{DATA}$ and is variable.

FIG. 4B shows a Table 1 indicating additional properties of the fields of the HE PPDU frame 400 of FIG. 4A, according to an embodiment.

The descriptions below, for sake of completeness and brevity, refer to OFDM-based 802.11 technology. Unless otherwise indicated, a station refers to a non-AP HE STA, and an AP refers to an HE AP.

Figure 5:
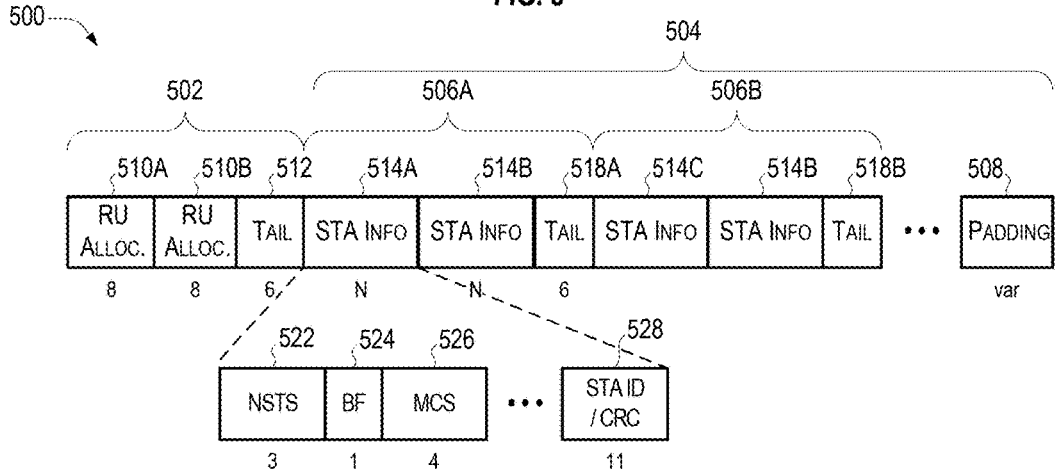
FIG. 5 illustrates an HE-SIG-B field, according to an embodiment.

FIG. 5 illustrates an HE-SIG-B field 500 according to an embodiment. The HE-SIG-B field 500 includes a common field 502 and a user-specific information field 504.

The common field 502 includes one more Resource Unit (RU) allocation subfields, in the example here first and second RU allocation subfields 510A and 510B. The common field 502 also includes a tail field 512.

The user-specific information field 504 include one or more per-station (per-STA) information fields, in the example here first and second per-STA information fields 506A and 506B. The user-specific information field 504 also includes padding 508.

Each of the per-STA information fields 506A and 506B includes one or two STA informations. In the example here, the first per-STA information field 506A includes first and second STA informations 514A and 514B, and the second per-STA information field 506B includes third and fourth STA informations 514C and 514D. The first and second per-STA information fields 506A and 506B also include respective tail bits 518A and 518B.

Each of the first to fourth STA informations 514A to 514D include a Number of Spatial Streams (NSTS) field 522 having 3 bits, a Beamforming (BF) field 5224 of one bit, a Modulation and Coding Scheme (MCS) field 526 having four bits, and other information specific to the stations to which the first to fourth STA informations 514A to 514D are respectively directed. In embodiments, the order and size of the fields may differ from those shown in FIG. 5.

Each of the first to fourth STA informations 514A to 514D also include a combined station identifier (STA ID) and Cyclic Redundancy Check (CRC) (collectively, STA ID/CRC) field 528. The STA ID/CRC field 528 for each STA information is created using an identifier, such as an Association Identifier (AID), of the station the STA information is directed to, and a CRC value computed using the remainder of the STA information.

Because the CRC is combined with STA-ID, no extra overhead is incurred by the use of CRC, which improves the efficiency of WLAN channel resource use relative to having separate STA ID and CRC fields. In addition, because a separate CRC is used to protect the contents of each STA information, errors in one STA information does not propagate to another STA information.

In an embodiment the STA ID/CRC field 528 is generated by combining a STA-ID value and a CRC value using a bit-wise exclusive-or (XOR) operation. All or part of the STA-ID value may be XOR'd with the CRC value.

Figure 6:
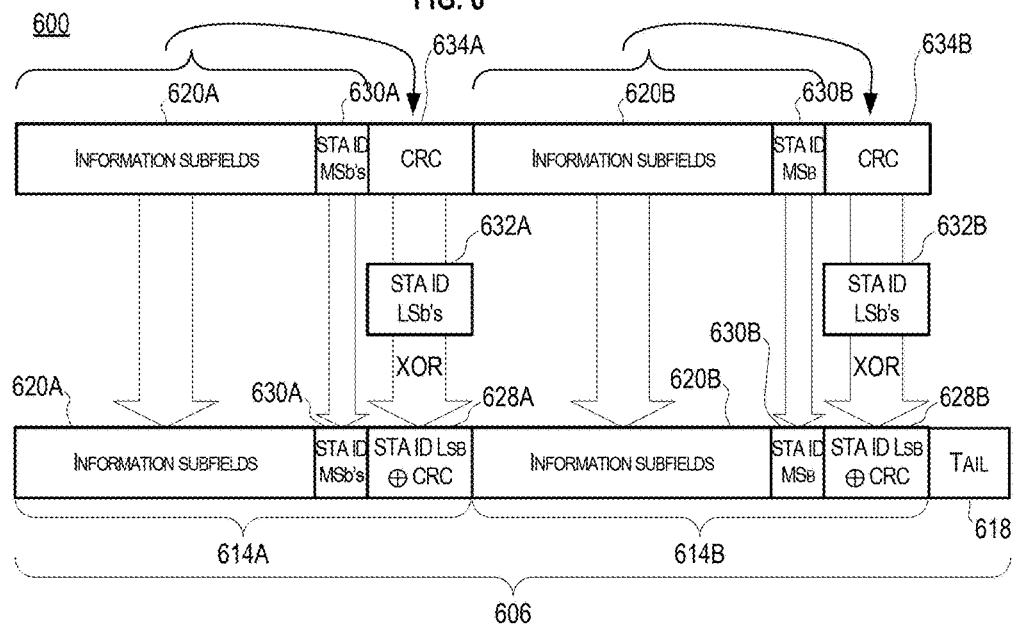
FIG. 6 illustrates a process for generating combined Station Identifier/Cyclic Redundancy Check (STA ID/CRC) fields, according to an embodiment.

FIG. 6 illustrates a process 600 for generating combined STA ID/CRC fields of a per-STA information field 606, according to an embodiment. The per-STA information field 606 includes first and second STA informations 614A and 614B and a BCC tail field 618.

The first STA information 614A includes first information fields 620A, which may include an NSTS field, a BF field, an MCS field, and so on. The first STA information 614A also includes first STA ID Most Significant bits (MSb's) field 630A corresponding to most significant bits of a STA ID. The STA ID may be of a station the first STA information 614A is directed to, or a STA ID reserved for other uses (e.g. broadcasts).

A first CRC value 634A is computed based on the first information fields 620A and the first STA ID MSb's field 630A. A first combined STA ID/CRC field 628A is generated by bitwise exclusive-or'd the first CRC value 634A with Least Significant bits (STA ID LSb's) 632A of the STA ID. The first combined STA ID/CRC field 628A is then included in the first STA information 614A.

The second STA information 614B includes second information fields 620B, second STA ID MSb's field 630B, and a second combined STA ID/CRC field 628A generated using a second CRC value 634B in the manner described for the first STA information 614A.

In the embodiment shown in FIG. 6, a bitwidth of a STA ID field is larger than a bitwidth of the CRC value. In another embodiment, a bitwidth of a STA ID field is the same as a bitwidth of the CRC value, all of the STA-ID bits are bitwise exclusive-or'd with respective bits of the CRC value, and none of STA-ID bits are used in calculating the CRC value.

In an embodiment, a CRC generating polynomial for a 4-bit CRC value can be $g(D)=D_4\ D+1$. In another embodiment, a CRC generating polynomial for an 8-bit CRC value can be $g(D)=D_8\ D_2\ D+1$. In another embodiment, a CRC generating polynomial for a 16-bit CRC value can be $g(D)=D_{16}+D_{12}+D_5+1$.

Because the CRC value and part or all of a STA-ID are bitwise exclusive-or'd, it is beneficial to have same number of bits in the STA ID and the CRC value, or to have as many CRC bits as possible without exceeding the number of bits in the STA ID. This provides improved CRC protection while keeping the overall overhead minimal.

FIG. 7A illustrates an HE-SIG-B field 700A, according to a first embodiment. The HE-SIG-B field 700A includes a common field 702 and a user-specific information field 704A. The user-specific information field 704A includes one or more per-STA information fields (in the example shown, first, second, and third per-STA information fields 706A-1, 706A-2, and 706A-3, respectively) and padding 708. The padding 708 is used to make the HE-SIG-B field 700A occupy a whole number of OFDM symbols.

Each of the per-STA information fields 706A-1, 706A-2, and 706A-3 includes control information for up to 2 stations: the first per-STA information field 706A-1 includes first and second STA informations 716-1 and 716-2, the second per-STA information field 706A-2 includes third and fourth STA informations 716-3 and 716-4, and the third per-STA information field 706A-3 includes fifth STA information 716-5. The first to third per-STA information fields 706A-1, 706A-2, and 706A-3 further include first to third CRC fields 718-1 to 718-3 and first to third tail bits 720-1 to 720-3, respectively.

The first to fifth STA informations 716-1 to 716-5 may respectively include control information for first to fifth stations.

The common field 702 includes resource allocation (RU) signaling for various bandwidths and can contain up to 4 RU allocation subfields. The example of FIG. 7 shows an HE-SIG-B field that is one of two HE-SIG-B fields (that is, first and second HE-SIG-B channels) in an 80 MHz PPDU, and therefore the common field 702 includes first and second RU allocation fields 710A and 710B, which respectively include RU allocation information for first and second 20 MHz bandwidths of the 80 MHz PPDU.

FIG. 7B illustrates an HE-SIG-B field 700B, according to a second embodiment. The HE-SIG-B field 700B differs from the HE-SIG-B field 700A in that the first, second, and third per-STA information fields 706B-1, 706B-2, and 706B-3 of the user-specific information field 704B do not include the CRC fields appended to the one or two STA information in each of the first, second, and third per-STA information fields 706A-1, 706A-2, and 706A-3 of the user-specific information field 704A of FIG. 7A.

One of a plurality of modulation and coding schemes (MCS) may be used to modulate an HE-SIG-B field, depending on device capabilities and channel conditions. The MCS used is generally indicated using an MCS index. FIG. 8 show a Table 2 listing modulation and code-rates for each of a plurality of MCS indexes.

A Code-Rate in Table 2 indicates an inverse of a number of bits transmitted for each bit of data. For example, when data is encoded according to an MCS Index of 0, having a code rate of 1/2, 2 bits are transmitted for each bit of data, and when data is encoded according to an MCS Index of 9, having a code rate of 5/6, 6 bits are transmitted for each 5 bits of data.

A Modulation in Table 2 indicates a modulation scheme for each carrier. For example, when data is encoded according to an MCS Index of 0, one transmitted bit is used to modulate each subcarrier, using Binary Phase Shift Keying (BPSK), during each symbol period, and when data is encoded according to an MCS Index of 9, 8 transmitted bits are used to modulate each subcarrier, using a 256-point-constellation Quadrature Amplitude Modulation (256-QAM), during each symbol period. Other modulation schemes that may be used are Quadrature Phase Shift Keying (QPSK) and QAM with other constellation sizes, as shown in Table 2.

Table 2 also shows a rate-matching unit, that is, a number of bits (or bit pairs) that may be grouped together when performing rate matching, for each MCS Index. For example, when data is encoded according to an MCS Index of 0, rate matching is performed on individual bits (transforming each bit into two bits), and when data is encoded according to an MCS Index of 9, rate matching is performed on groups of 5 bits (transforming each group of 5 bits into 6 bits).

Table 2 also shows a number of subcarriers per OFDM symbol ($N_{SD}$) in an HE-SIG-B field. From this, a number of encoded (post-rate-matching) bits per OFDM symbol $N_{CBPS}$ can be computed as the product of the number of bits used to modulate each subcarrier during each symbol period and the number of subcarriers. For example, when data is encoded according to an MCS Index of 0, each 52-subcarrier OFDM symbol includes 52 encoded bits and $N_{CBPS}$=52, and when data is encoded according to an MCS Index of 9, each 52-subcarrier OFDM symbol includes 416 encoded bits and $N_{CBPS}$=416.

From the Code-Rate and the number of encoded bits per OFDM symbol $N_{CBPS}$, a number of payload bits per OFDM symbol $N_{DBPS}$ can be determined. For example, when data is encoded according to an MCS Index of 0, each 52-subcarrier OFDM symbol includes 26 payload bits (half the number of encoded bits) and $N_{DBPS}$=26, and when data is encoded according to an MCS Index of 9, each 52-subcarrier OFDM symbol includes floor(416×5/6)=346 encoded bits and $N_{DBPS}$=346.

In some WLAN transmissions, information is structured such that BCC encoded signals after rate matching are generated in units of OFDM symbols. Accordingly, a number of bits in the padding field of an HE-SIG-B field may be adjusted so that the HE-SIG-B field has a length equal to an integer multiple of the number of payload bits per OFDM symbol $N_{DBPS}$ for the MCS used to transmit the HE-SIG-B field. For example, referring to Table 2, if the HE-SIG-B field is to be transmitted according to an MCS Index of 6 (3/4 Code-Rate, 64-QAM), padding may be added to the HE-SIG-B field to produce a padded length of the HE-SIG-B field that is an integer multiple of 234 bits.

For implementation reasons, a receiver may be designed to decode the common field and the per-STA information field(s) of an HE-SIG-B field separately. However, in an embodiment, a size of the common field and a size of the per-STA information field(s) are not designed to enable rate-matching in a manner that allows separate decoding of the common and the per-STA information field in a straightforward manner.

Figure 9:
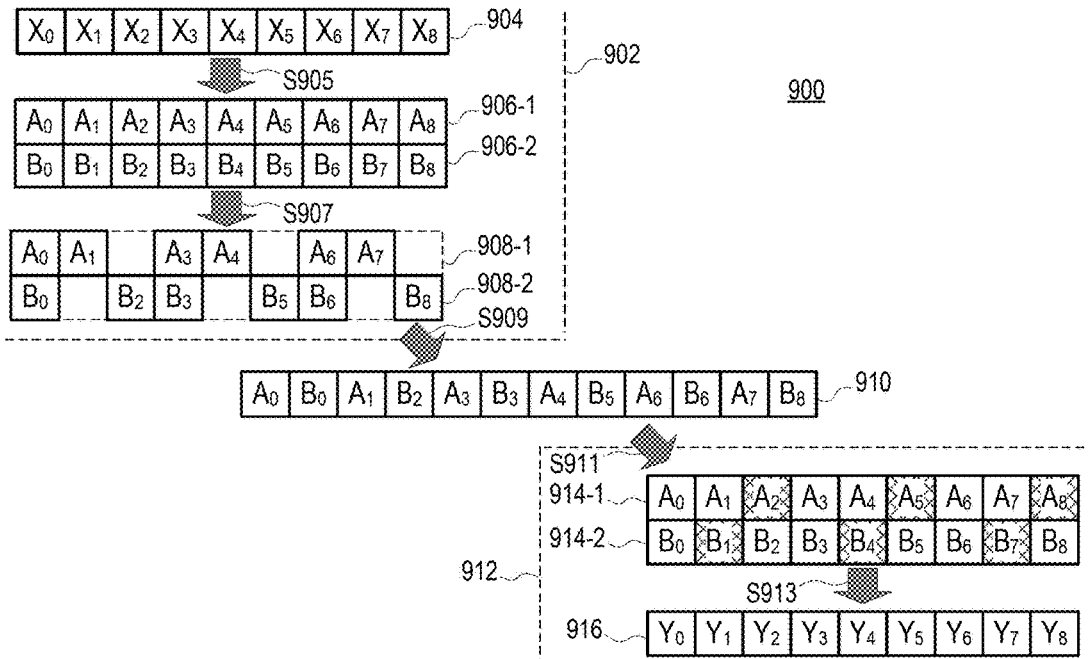
FIG. 9 illustrates a process of encoding and decoding at a code-rate of 3/4, according to an embodiment.
Figure 10:
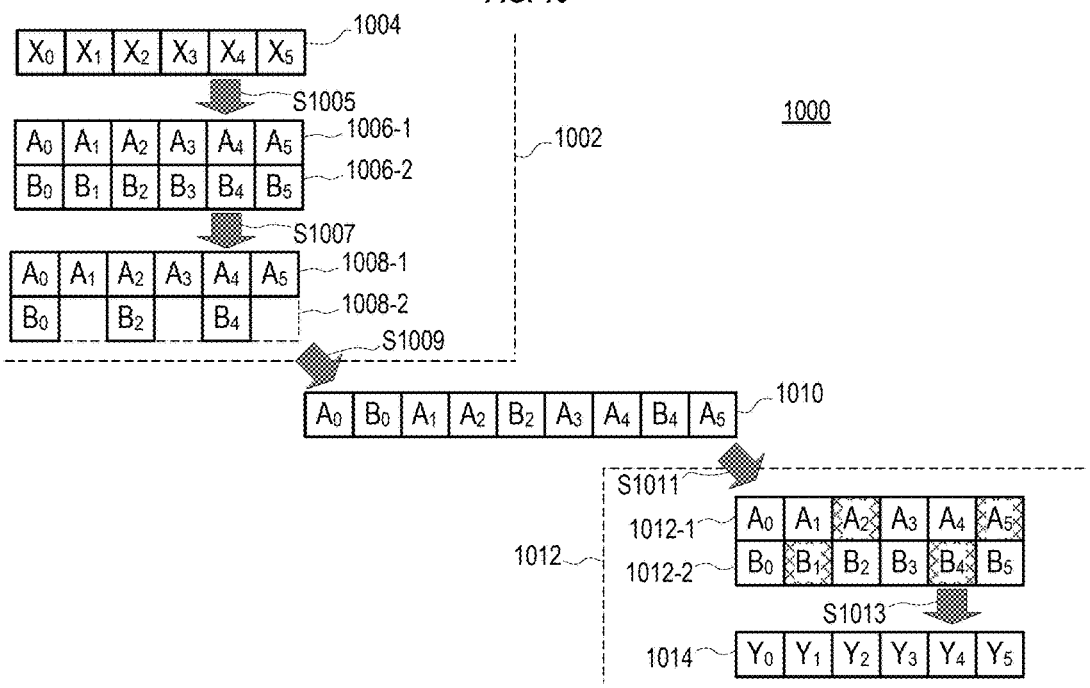
FIG. 10 illustrates a process of encoding and decoding at a code-rate of 2/3, according to an embodiment.
Figure 11:
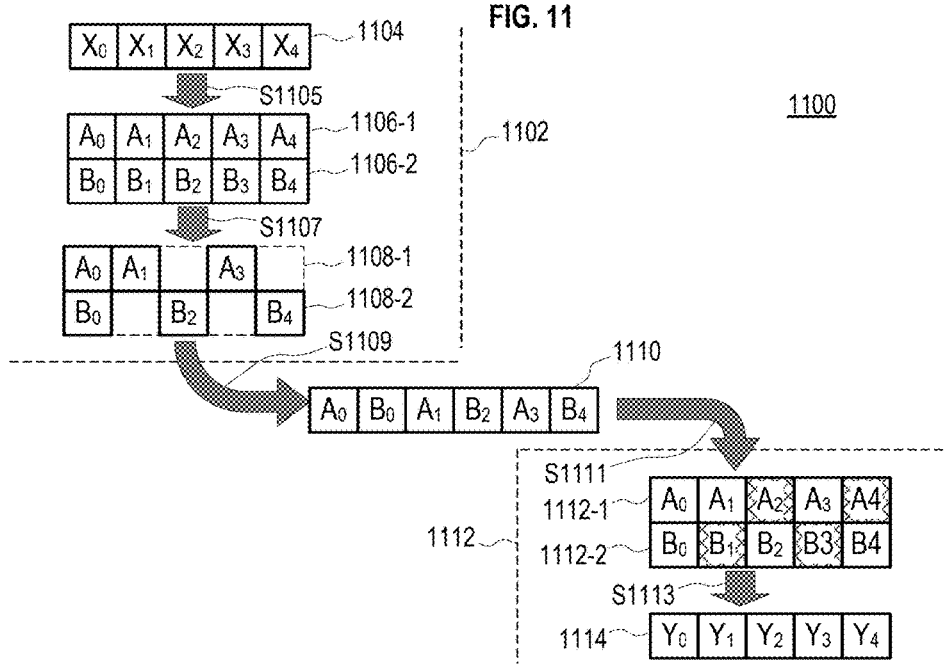
FIG. 11 illustrates a process of encoding and decoding at a code-rate of 5/6, according to an embodiment.

FIGS. 9, 10, and 11 illustrate processes for encoding and decoding at code-rates of 3/4, 2/3, and 5/6, respectively, using puncturing.

FIG. 9 illustrates a process 900 of encoding and decoding at a code-rate of 3/4, according to an embodiment. Rate matching for binary convolutional code (BCC) is adapting the code-rate for a given payload by puncturing the 1/2 code-rate (i.e. mother code-rate) encoded bits.

In a transmitter 902, at S905 a payload 904 is encoded at a "mother code-rate" of 1/2 using a pair of polynomials. A first set of encoded bits 906-1 having a same length as the payload 904 is generated by a convolution encoder using a first generator polynomial. A second set of encoded bits 906-2 having a same length as the payload 904 is generated by a convolution encoder using a second generator polynomial. Bits in the first set of encoded bits 906-1 are indicated as A0, A1, A2, and so on, with A0 the earliest bit in the first set of encoded bits 906-1. Bits in the second set of encoded bits 906-2 are indicated as B0, B1, B2, and so on, with B0 the earliest bit in the second set of encoded bits 906-2.

In an embodiment, the first generator polynomial g0=$133_8$ and the second generator polynomial g1=$171_8$. Accordingly, for a value t, a bit $A_t$ in the first set of encoded bits 906-1 is equal to $X_t+X_{t-2}+X_{t-3}+X_{t-5}+X_{t-6}$, and a bit $B_t$ in the first set of encoded bits 906-2 is equal to $X_t+X_{t-1}+X_{t-2}+X_{t-3}+X_{t-6}$.

At S907, the first and second sets of encoded bits 906-1 and 906-2 are punctured to generate first and second sets of punctured encoded bits 908-1 and 908-2. In each triplet of paired A and B bits, the third A bit and the second B bits are omitted. For example, in the triplet of bit pairs {{A0, B0}, {A1, B1}, {A2, B2}}, bits A2 and B1 are omitted, leaving 4 bits. In the triplet of bit pairs {{A3, B3}, {A4, B4}, {A5, B5}}, bits A5 and B4 are omitted. The omitted bits may be referred to as stolen bits.

At S909, the first and second punctured encoded bits 908-1 and 908-2 are transmitted in sequence as a punctured encoded bit stream 910. In the punctured encoded bit stream 910, bits of the first set of punctured encoded bits 908-1 are output before corresponding bits of the second set of punctured encoded bits 908-2, for example, A0 is output before B0. A0 is the earliest bit of the punctured encoded bit stream 910, and corresponds to an earliest value of the punctured encoded bit stream 910 as received by a receiver 912.

In the receiver 912, at S911, the punctured encoded bit stream 910 is received, separated into two sets of value, and dummy values (indicated by shading) are inserted into the two sets of values at the locations of the stolen bits to produce first and second sets of received encoded values 914-1 and 914-2. The distribution of bits in the punctured encoded bit stream 910 to the two sets of values and the locations at which dummy bits are inserted are determined by the puncturing pattern used in S907. In an embodiment, the dummy bits have a value of zero.

At S913, the first and second sets of received encoded bits 914-1 and 914-2 are decoded to produce the received bits 916. In an embodiment, the first and second sets of received encoded values 914-1 and 914-2 are decoded using a Viterbi decoder.

FIG. 10 illustrates a process 1000 of encoding and decoding at a code-rate of 2/3, according to an embodiment.

In a transmitter 1002, at S1005 a payload 1004 is encoded at a code-rate of 1/2 using a pair of polynomials to produce first and second sets of encoded bits 1006-1 and 1006-2, as described above for the first and second sets of encoded bits 906-1 and 906-2 of FIG. 9. Bits in the first set of encoded bits 1006-1 are indicated as A0, A1, A2, and so on. Bits in the second set of encoded bits 1006-2 are indicated as B0, B1, B2, and so on.

At S1007, the first and second sets of encoded bits 1006-1 and 1006-2 are punctured to generate first and second sets of punctured encoded bits 1008-1 and 1008-2. In each pair of paired A and B bits, the second B bit is omitted. For example, in the pair of bit pairs {{A0, B0}, {A1, B1}}, bit B1 is omitted, leaving 3 bits. In the pair of bit pairs {{A2, B2}, {A3, B3}}, bit B3 are omitted.

At S1009, the first and second punctured encoded bits 1008-1 and 1008-2 are transmitted in sequence as a punctured encoded bit stream 1010. In the punctured encoded bit stream 1010, bits of the first set of punctured encoded bits 1008-1 are output before corresponding bits of the second set of punctured encoded bits 1008-2, for example, A0 is output before B0.

In a receiver 1012, at S1011, the punctured encoded bit stream 1010 is received, distributed into two sets of values, and dummy bits (indicated by shading) are inserted at the locations of the stolen bits to produce first and second sets of received encoded values 1012-1 and 1012-2. The distribution of bits in the punctured encoded bit stream 1010 to the two sets of values and the locations at which dummy bits are inserted are determined by the puncturing pattern used in S1007. In an embodiment, the dummy bits have a value of zero.

At S1013, the first and second sets of received encoded values 1012-1 and 1012-2 are decoded to produce the received bits 1014. In an embodiment, the first and second sets of received encoded values 1012-1 and 1012-2 are decoded using a Viterbi decoder.

FIG. 11 illustrates a process 1100 of encoding and decoding at a code-rate of 5/6, according to an embodiment.

In a transmitter 1102, at S1105 a payload 1104 is encoded at a code-rate of 1/2 using a pair of polynomials to produce first and second sets of encoded bits 1106-1 and 1106-2, as described above for the first and second sets of encoded bits 906-1 and 906-2 of FIG. 9. Bits in the first set of encoded bits 1106-1 are indicated as A0, A1, A2, and so on. Bits in the second set of encoded bits 1106-2 are indicated as B0, B1, B2, and so on.

At S1107, the first and second sets of encoded bits 1106-1 and 1106-2 are then punctured to generate first and second sets of punctured encoded bits 1108-1 and 1108-2. In each quintuplet of paired A and B bits, the second B bit, third A bit, fourth B bit, and fifth A bit are omitted. For example, in the quintuplet of bit pairs {{A0, B0}, {A1, B1}, {A2, B2}, {A3, B3}, {A4, B4}}, bits B1, A2, B3, and A4 are omitted, leaving 6 bits.

At S1109, the first and second punctured encoded bits 1108-1 and 1108-2 are transmitted in sequence as a punctured encoded bit stream 1110. In the punctured encoded bit stream 1110, bits of the first set of punctured encoded bits 1108-1 are output before corresponding bits of the second set of punctured encoded bits 1108-2, for example, A0 is output before B0.

In a receiver 1112, at S1111, the punctured encoded bit stream 1110 is received distributed into two sets of values, and dummy bits (indicated by shading) are inserted at the locations of the stolen bits to produce first and second sets of received encoded bits 1112-1 and 1112-2. The distribution of bits in the punctured encoded bit stream 1110 to the two sets of values and the locations at which dummy bits are inserted are determined by the puncturing pattern used in S1107. In an embodiment, the dummy bits have a value of zero.

At S1113, the first and second sets of received encoded bits 1112-1 and 1112-2 are decoded to produce the received bits 1114. In an embodiment, the first and second sets of received encoded bits 1112-1 and 1112-2 are decoded using a Viterbi decoder.

As shown above, rate-matching for BCC is performed in units of 1, 2, 3, or 5 bits, depending on which code-rate is used. For 1/2 code-rate transmission, no rate-matching needs to be performed. For 2/3 code-rate transmission, information bits are taken in units of 2 for rate-matching purposes, that is, the rate-matching unit is 2 bits. For 3/4 code-rate transmission, the rate-matching unit is 3 bits. For 5/6 code-rate transmission, rate-matching unit is 5 bits.

When a code-rate of 2/3, 3/4, or 5/6 is used and a common field or a per-STA information field of an HE-SIG-B field does not have a length that is an integer multiple of 2, 3, or 5, respectively, how to apply rate-matching for the content of the HE-SIG-B field must be determined.

Figure 12:
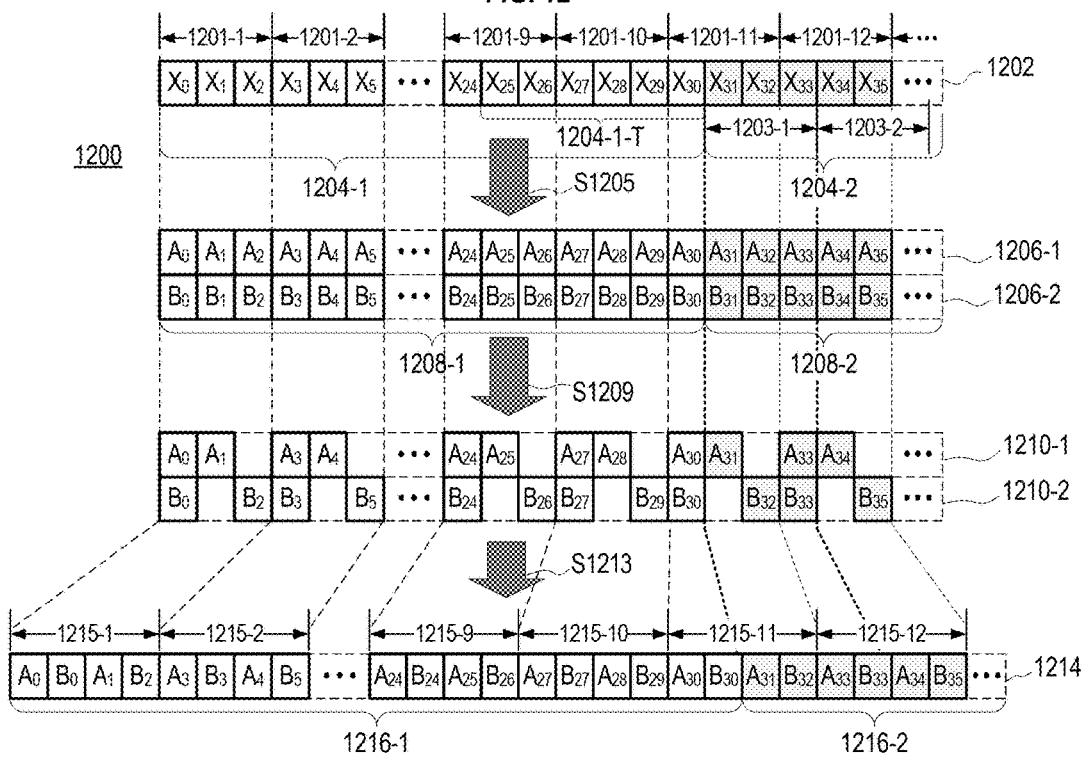
FIG. 12 illustrates a process for BCC rate-matching a portion of an HE-SIG-B field, according to an embodiment.

FIG. 12 illustrates a process 1200 for BCC rate-matching of a portion of an HE-SIG-B field 1202, according to an embodiment. The processor may be performed by a device in a WLAN performing a transmission, such as an AP. In the example provided, the code-rate is 3/4 with rate-matching unit of 3 bits, but embodiments are not limited thereto.

The HE-SIG-B field 1202 includes a first information field 1204-1 which is one of a common field or a per-STA information field, and a second information field 1204-2 which is a per-STA information field. The HE-SIG-B field 1202 may also include addition information fields, which may be per-STA information fields. In the embodiment, each of the common field or per-STA information fields included in the HE-SIG-B field 1202 are treated as a separate BCC encoding and rate-matching block (hereinafter, BCC block). Accordingly, each of the fields includes a 6-bit tail at the end of the field, such as the 6 tail bits 1204-1-T shown included in the first information field 1204-1-T.

In the embodiment of FIG. 12, rate-matching is performed as if information in the HE-SIG-B field was a single codeword. Therefore, the HE-SIG-B field includes a plurality of consecutive 3-bit rate-matching units 1202-1, 1202-2, ..., 1202-12, and so on. In the example, the first information field 1204-1 has a length of 31 bits that is not a multiple of the rate-matching unit, but embodiments are not limited thereto. In contrast, in previously known 802.11 systems, BCC blocks are designed to have lengths equal to an integer multiple of the rate-matching units that might be used to encode the of BCC block.

Therefore, in the embodiment, wherein i) the BCC blocks are not always a multiple of the rate-matching unit, and ii) the end result is to be the same as if the rate matching was performed on the HE-SIG-B field as a single codeword, a puncturing pattern used for an BCC block in the HE-SIG-B field may vary depending on the location of the BCC block, and in particular may be based on a number of bits preceding the BCC block in the HE-SIG-B field.

At S1205, the HE-SIG-B field 1202 is encoded at a "mother code-rate" of 1/2 using a pair of polynomials to produce first and second sets of encoded bits 1206-1 and 1206-2, as described above for the first and second sets of encoded bits 906-1 and 906-2 of FIG. 9. Bits in the first set of encoded bits 1206-1 are indicated as A0, A1, A2, and so on. Bits in the second set of encoded bits 1206-2 are indicated as B0, B1, B2, and so on. In an embodiment, each of the information fields 1204-1 and 1204-2 are separately encoded at the mother code-rate.

The first information field 1204-1 is encoded to form a first portion 1208-1 of the first and second sets of encoded bits 1206-1 and 1206-2. The second information field 1204-2 is encoded to form a second portion 1208-2 of the first and second sets of encoded bits 1206-1 and 1206-2.

At S1209, the first and second sets of encoded bits 1206-1 and 1206-2 are punctured to generate first and second sets of punctured encoded bits 1210-1 and 1210-2.

In each triplet of paired A and B bits for the first portion 1208-1 of the first and second sets of encoded bits 1206-1 and 1206-2, corresponding to the first through tenth rate-matching units 1201-1 to 1201-10 and a portion of the rate-matching units 1201-11, the third A bit and the second B bits are omitted. For example, in the triplet of bit pairs {{A0, B0}, {A1, B1}, {A2, B2}} corresponding to the first rate-matching unit 1201-1, the third A bit (A2) and the second B bit (B1) are omitted, leaving 4 bits, and in the triplet of bit pairs {{A3, B3}, {A4, B4}, {A5, B5}}, corresponding to the second rate-matching unit 1201-2, the third A bit (A5) and the second B bit (B4) are omitted, leaving 4 bits. The omitted bits may be referred to as stolen bits.

In the embodiment, the transmitted bit stream 1214 produced by the process 1200 is identical to what would be produced if the HE-SIG-B field 1202 were punctured using a same puncturing pattern for each the rate-matching units 1201-1, 1201-2, . . . 1201-12, and so on. However, when the second information field 1204-2 is encoded separately from the first information field 1204-1, the second information 1204-2 may be encoded and punctured using offset rate-matching units 1203-1, 1203-2, and so on. As a result, the puncturing pattern used for the offset rate-matching units 1203-1, 1203-2, and so on may be different from the puncturing pattern used for the first to tenth rate matching units 1201-1 to 1201-10.

As can be seen in FIG. 12, the pattern used to puncture the offset rate-matching units 1203-1, 1203-2, and so on of second portion 1208-2 of the first and second sets of encoded bits 1206-1 and 1206-2, corresponding to the second field 1204-2 (hereinafter, the offset pattern) is equivalent to a bit-wise rotation of the pattern used to puncture the mother-rate encoded bits of the first and rate-matching units 1201-1, 1203-2, and so on. The amount of the bit-wise rotation is determined by the number of bits remaining after the last complete rate-matching unit to occur before the second field 1204-2. A number of such bits remaining Z is equal to:

$$Z = N \text{ modulo } K \qquad \text{Equation 1}$$

wherein N is the number of bits in the HE-SIG-B field that precede the second field 1204-2 and K is the size ($N_{RM}$) of the rate-matching units in bits.

In the example of FIG. 12, N equals 31, K equals 3, and Z is equal to 1 (indicating that only 1 bit, X30, remains after the last complete rate-matching unit preceding the second field 1204-2. As a result, the offset pattern used to puncture the first offset rate-matching unit 1203-1 of the BCC block including the second information field 1204-2 is equal to the pattern used to puncture the rate-matching units 1201-1, 1202-2, etcetera, cyclically rotated Z bits to the left (here, 1).

Therefore, in the triplet of bit pairs {{A31, B31}, {A32, B32}, {A33, B33}} that comprise the encoded bits of the first offset rate-matching unit 1203-1, the second A bit (A32) and the first B bit (B31) are deleted, instead of the third A bits and the second B bit as was the case in the rate-matching units 1201-1, 1202-2, etcetera.

At S1213, the first and second punctured encoded bits 1210-1 and 1210-2 are sent for transmission in a sequence as a punctured encoded bit stream 1214. In the punctured encoded bit stream 1214, bits of the first set of punctured encoded bits 1210-1 are ordered before corresponding bits of the second set of punctured encoded bits 1210-2, for example, A0 is ordered before B0.

Figure 13:
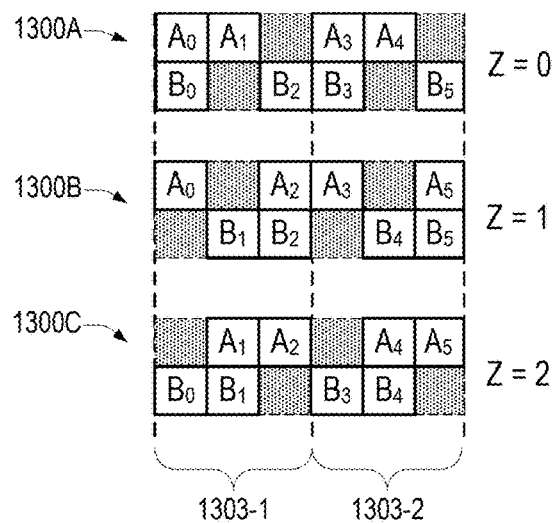
FIG. 13 illustrates patterns for puncturing a rate-matching unit for a code-rate of 3/4 and based on a number of bits preceding the rate-matching unit, according to an embodiment.

FIG. 13 illustrates patterns for puncturing first and second rate-matching units 1303-1 and 1303-2 for a code-rate of 3/4 based on a number of bits preceding the rate-matching unit, according to an embodiment.

A first puncturing pattern 1300A is used when, for N equal to a number of bits in the HE-SIG-B field that precede the rate-matching unit and K being the size of the rate-matching unit (here, 3), N modulo K (represented by Z) is equal to zero. When the first puncturing pattern 1300A is used, the respective third A and second B bits of the rate-matching units 1303-1 and 1303-2 are discarded.

A second puncturing pattern 1300B is used when Z is equal to one. When the second puncturing pattern 1300B is used, the respective second A and first B bits of the rate-matching units 1303-1 and 1303-2 are discarded.

A third puncturing pattern 1300C is used when Z is equal to two. When the third puncturing pattern 1300C is used, the respective first A and third B bits of the rate-matching units 1303-1 and 1303-2 are discarded.

Figure 14:
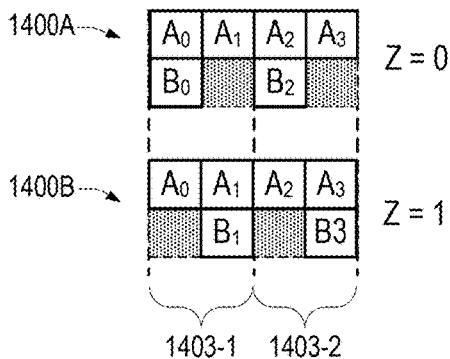
FIG. 14 illustrates patterns for puncturing a rate-matching unit for a code-rate of 2/3 and based on a number of bits preceding the rate-matching unit, according to an embodiment.

FIG. 14 illustrates patterns for puncturing first and second rate-matching units 1403-1 and 1403-2 for a code-rate of 2/3 based on a number of bits preceding the rate-matching unit, according to an embodiment.

A first puncturing pattern 1400A is used when, for N equal to a number of bits in the HE-SIG-B field that precede the rate-matching unit and K being the size of the rate-matching unit (here, 2), N modulo K (represented by Z) is equal to zero. When the first puncturing pattern 1400A is used, the respective second B bits of the rate-matching units 1403-1 and 1403-2 are discarded.

A second puncturing pattern 1400B is used when Z is equal to one. When the second puncturing pattern 1400B is used, the respective first B bits of the rate-matching units 1403-1 and 1403-2 are discarded.

Figure 15:
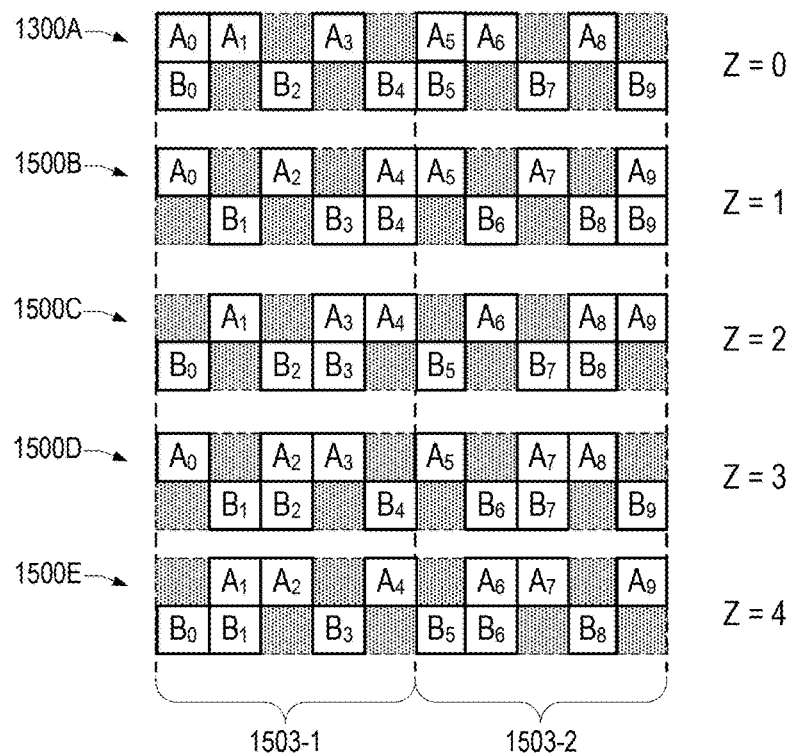
FIG. 15 illustrates patterns for puncturing a rate-matching unit for a code-rate of 5/6 and based on a number of bits preceding the rate-matching unit, according to an embodiment.

FIG. 15 illustrates patterns for puncturing first and second rate-matching units 1503-1 and 1503-2 for a code-rate of 5/6 based on a number of bits preceding the rate-matching unit, according to an embodiment.

A first puncturing pattern 1500A is used when, for N equal to a number of bits in the HE-SIG-B field that precede a rate-matching unit and K being the size of the rate-matching unit (here, 5), N modulo K (represented by Z) is equal to zero. When the first puncturing pattern 1500A is used, the respective third A, fifth A, second B, and fourth B bits of the rate-matching units 1503-1 and 1503-2 are discarded.

A second puncturing pattern 1500B is used when Z is equal to one. When the second puncturing pattern 1500B is used, the respective second A, fourth A, first B, and third BB bits of the rate-matching units 1503-1 and 1503-2 are discarded.

A third puncturing pattern 1500C is used when Z is equal to two. When the third puncturing pattern 1500C is used, the respective first A, third A, second B, and fifth B bits of the rate-matching units 1503-1 and 1503-2 are discarded.

A fourth puncturing pattern 1500D is used when Z is equal to three. When the fourth puncturing pattern 1500D is used, the respective second A, fifth A, first B, and fourth B bits of the rate-matching units 1503-1 and 1503-2 are discarded.

A fifth puncturing pattern 1500E is used when Z is equal to four. When the fifth puncturing pattern 1500E is used, the respective first A, fourth A, third B, and fifth B bits of the rate-matching units 1503-1 and 1503-2 are discarded.

In an embodiment wherein a receiver processes each information field in a received HE-SIG-B field as a separate BCC block, the receiver must identify the rate-matching pattern for each information field and apply a corresponding de-rate-matching and decoding algorithms for each BCC block, according to the number of bits before each BCC block in the HE-SIG-B field before it was encoded.

In other embodiments, filler bits are inserted after each information field in an HE-SIG-B field so that each BCC block starts at a rate-matching unit boundary, that is, so that each information field corresponding to a BCC block (that is, a common field and each of one or more per-STA information fields) in the HE-SIG-B field has a length equal to an integer multiple of the rate-matching unit size K (K being one of 1, 2, 3 and 5) for the MCS being used to encode the RE-SIG-B field.

For example, when a length of a common field of an HE-SIG-B field is 18 and a rate-matching unit size K is equal to 5, then 2, 7 or, for some positive integer n, n×K+2 filler bits may be appended to the common field to make the common field an integer multiple of K bits long.

Figure 16:
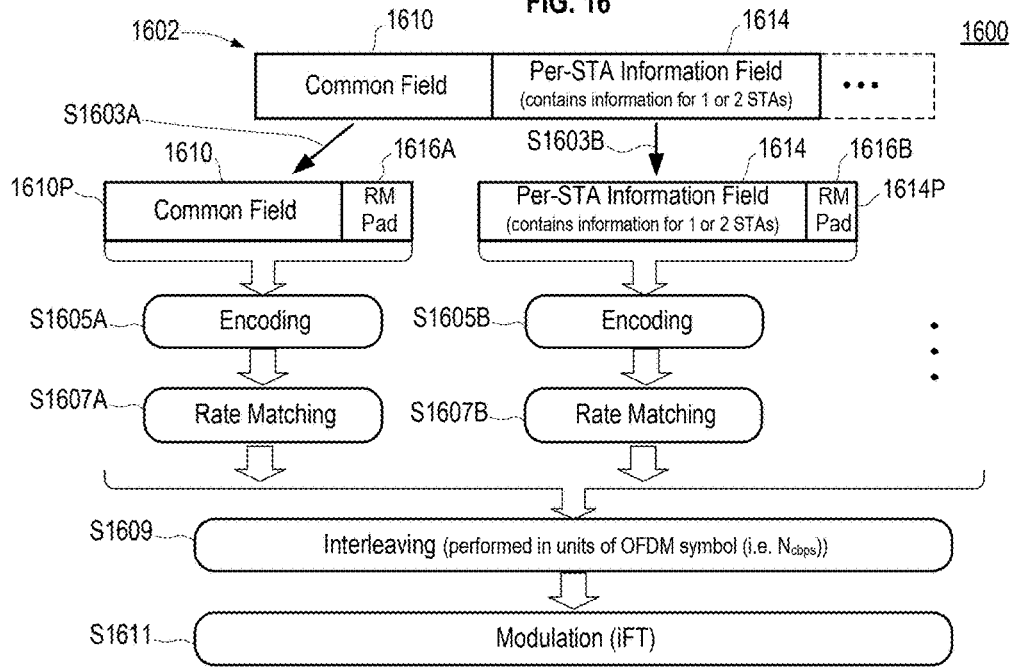
FIG. 16 illustrates a process for encoding and rate-matching an HE-SIG-B field using rate-matching based padding, according to an embodiment.

FIG. 16 illustrates a process 1600 for encoding and rate-matching an HE-SIG-B field 1602 using rate-matching based padding, according to an embodiment. The HE-SIG-B field 1602 includes a common field 1610 and one or more per-STA information fields 1614. Each per-STA information field 1614 includes information for one or two stations.

At S1603A, the process 1600 appends padding bits 1616A to the common field 1610 to generate a padded common field 1610P. A length of the padding bits 1616A is selected to produce the padded common field 1610P having a length equal to an integer multiple of the rate-matching unit corresponding to an MCS being used to encode and rate-match the HE-SIG-B field 1602.

At S1603B, the process 1600 appends padding bits 1616B to the per-STA information fields 1614 to generate a padded per-STA information fields 1614P. A length of the padding bits 1616A is selected to produce the padded common field 1610P having a length equal to an integer multiple of the rate-matching unit corresponding to the MCS.

In an embodiment of the process 1600, the padding bits 1616A and 1616B may inserted anywhere within the common field 1610 and each of the user-specific information fields 1614, instead of being at the end, and need not be contiguous.

At S1605A and S1605B, the padded common field 1610P and the padded per-STA information fields 1614P are respectively encoded at the mother code-rate of 1/2. At S1607A and S1607B, the encoded padded common field 1610P and the encoded padded per-STA information fields 1614P are respectively rate-matched using a puncturing pattern corresponding to the MCS.

The puncturing pattern is not dependent of the respective locations of the common field 1610 and or the per-STA information fields 1614 within the HE-SIG-B field 1602. Accordingly, each of the common field 1610 and the one or more per-STA information fields 1614 will have be rate-matched using an identical puncturing pattern and are each boundary aligned with the rate-matching units of the transmission.

At S1609, the encoded rate-matched padded common field 1610P and the one or more encoded rate-matched padded per-STA information fields 1614P are concatenated and frequency interleaved in units of the OFDM symbol. That is, blocks of the combined encoded rate-matched padded common field 1610P and the one or more encoded rate-matched padded per-STA information fields 1614P, each blocks having a length equal to the number of bits in the OFDM symbol $N_{CBPS}$ for the MCS, are interleaved among subcarriers of the OFDM symbol.

At S1611, the output of the interleaving process S1609 is modulated using an inverse Fourier Transform (iFT), such as an inverse Fast Fourier Transform (iFFT). The output of the modulation process S1611 is then transmitted.

Figure 17:
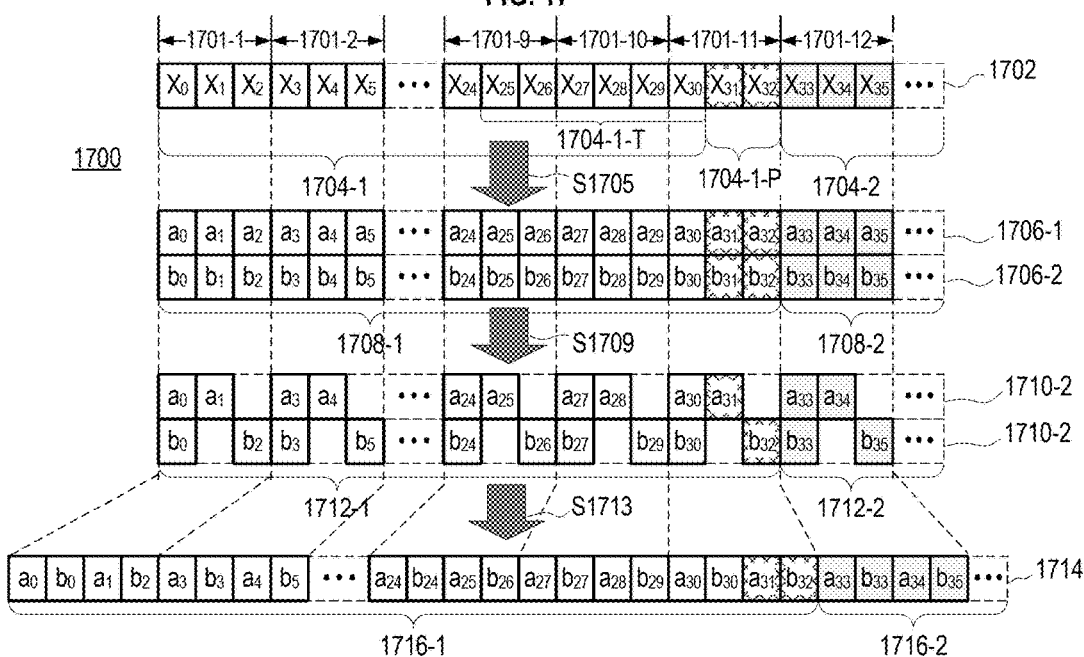
FIG. 17 further illustrates the operation of the process of FIG. 16, according to an embodiment.

FIG. 17 illustrates a process 1700 for BCC rate-matching of a portion of an HE-SIG-B field 1702, according to the embodiment of FIG. 16. The process 1700 may be performed by a device in a WLAN performing a transmission, such as an AP. In FIG. 17, the code-rate is 3/4 and the rate-matching unit is therefore 3 bits, but embodiments are not limited thereto.

The HE-SIG-B field 1702 includes a first information field 1704-1 which is one of a common field or a per-STA information field, and a second information field 1704-2 which is a per-STA information field. The HE-SIG-B field 1702 may also include addition information fields, which would be per-STA information fields. In the embodiment, each of the common field or per-STA information fields included in the HE-SIG-B field 1702 are treated as a separate BCC encoding and rate-matching block (hereinafter, BCC block). Accordingly, each of the information fields includes a 6-bit tail at the end of the field, such as the 6 tail bits 1704-1-T shown included in the first field 1704-1-T.

In the embodiment of FIG. 17, rate-matching is performed independently for each of information fields 1704-1 and 1704-2. Therefore, the HE-SIG-B field includes a plurality of consecutive 3-bit rate-matching units 1702-1, 1702-2, ..., 1702-12, and so on.

In the example, the first information field 1704-1 has an unpadded length of 31 bits that is not a multiple of the rate-matching unit, but embodiments are not limited thereto. In contrast, in previously known 802.11 systems, information fields that were to be BCC encoded and rate matched as a unit are designed to have lengths equal to an integer multiple of the rate-matching units that might be used to encode the of information field.

Therefore, in the embodiment, wherein rate-matching is performed separately for separate information fields within the HE-SIG-B field, each information fields is padded to be a multiple of the rate-matching unit. In the example of FIG. 17, the first information field 1704-1 is padded with padding bits 1704-1-P, which adds two bits to the length of the first information field 1704-1. As a result, the first information field 1704-1 has a length of 33, which is an integer number of the rate-matching units 1702-1, 1702-2, and so on.

At S1705, the first and second information fields 1704-1 and 1704-2, after padding, are each encoded at a "mother code-rate" of 1/2 using a pair of polynomials to produce first and second sets of encoded bits 1706-1 and 1706-2, as described above for the first and second sets of encoded bits 906-1 and 906-2 of FIG. 9. Bits in the first set of encoded bits 1706-1 are indicated as A0, A1, A2, and so on. Bits in the second set of encoded bits 1706-2 are indicated as B0, B1, B2, and so on.

The first information field 1704-1, including padding bits 1704-1-P, is encoded to form a first portion 1708-1 of the first and second sets of encoded bits 1706-1 and 1706-2. The second information field 1704-2 is encoded to form a second portion 1708-1 of the first and second sets of encoded bits 1706-1 and 1706-2.

At S1709, the first and second sets of encoded bits 1706-1 and 1706-2 are punctured to generate first and second sets of punctured encoded bits 1710-1 and 1710-2.

In each consecutive triplet of paired A and B bits of the first and second sets of encoded bits 1706-1 and 1706-2 (each triplet of paired bits corresponding to a rate-matching unit) the third A bit and the second B bits are discarded. For example, in the triplet of bit pairs {{A0, B0}, {A1, B1}, {A2, B2}} corresponding to the first rate-matching unit 1701-1, the third A bit (A2) and the second B bit (B1) are omitted, leaving 4 bits; in the triplet of bit pairs {{A30, B30}, {A31, B31}, {A32, B32}}, corresponding to the eleventh rate-matching unit 1701-11, the third A bit (A32) and the second B bit (B31) are omitted, leaving 4 bits; and in the triplet of bit pairs {{A33, B33}, {A34, B34}, {A35, B35}}, corresponding to the twelfth rate-matching unit 1701-12, the third A bit (A35) and the second B bit (B32) are omitted, leaving 4 bits. The discarded bits may be referred to as stolen bits.

At S1713, the first and second punctured encoded bits 1710-1 and 1710-2 are transmitted in sequence as a punctured encoded bit stream 1714. The punctured encoded bit stream 1714 includes a first portion 1716-1 corresponding to the first field 1704-1 and the padding 1704-1-P, and a second portion 1716-2 corresponding to the second field 1704-2 and any padding that it might have appended to it. In the punctured encoded bit stream 1714, bits of the first set of punctured encoded bits 1710-1 are ordered before corresponding bits of the second set of punctured encoded bits 1710-2, for example, A0 is ordered before B0.

Figure 18:
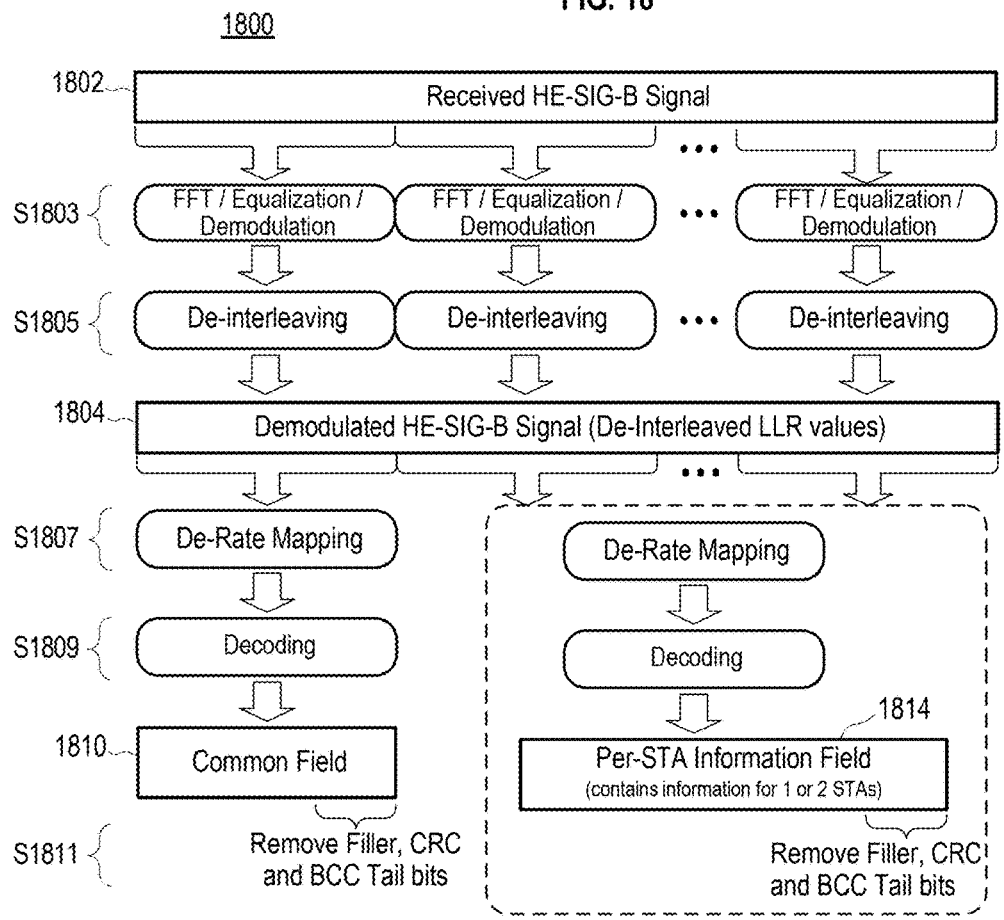
FIG. 18 illustrates a process for de-rate-matching and decoding a signal encoded and rate matched using the process of FIG. 16, according to an embodiment.

FIG. 18 illustrates a process 1800 for decoding a received HE-SIG-B signal 1802, according to an embodiment. The process 1800 is suitable for use by a wireless device to decode a transmission performed according to the process 1600 of FIG. 16.

As S1803, the received HE-SIG-B signal 1802 is demodulated and equalized to produce a demodulated and equalized received HE-SIG-B signal. The equalization may include phase tracking and compensation. The demodulation may output signals in the form of log-likelihood ratio (LLR) values.

At S1805, the demodulated and equalized received HE-SIG-B signal is de-interleaved in units of OFDM signals to generate a demodulated received HE-SIG-B signal 1804. When the demodulation of S1803 outputs signals in the form of LLR values, the LLR values are de-interleaved in units of OFDM symbols to generate the demodulated received HE-SIG-B signal 1804 and then sent for de-rate mapping at S1807.

At S1807, the demodulated received HE-SIG-B signal 1804 is divided into blocks, and each block is de-rate-mapped. De-rate mapping includes inserting dummy bits to replace bits discarded during a rate mapping performed at, for example, S1607A or S1607B of FIG. 16. The ordering of the values of the demodulated received HE-SIG-B signal 1804 and the dummy bits is determined by the puncturing pattern used during the rate mapping.

At S1809, the de-rate-mapped blocks are each decoded to produce a common field 1810 and one or more per-STA information fields 1814. A Viterbi algorithm may be used to perform the decoding.

At S1811, the CRC and BCC tail bits, and any filler bits added at, for example, S1603 or S1603B of FIG. 16, are removed from the common field 1810 and one or more per-STA information fields 1814.

Figure 19:
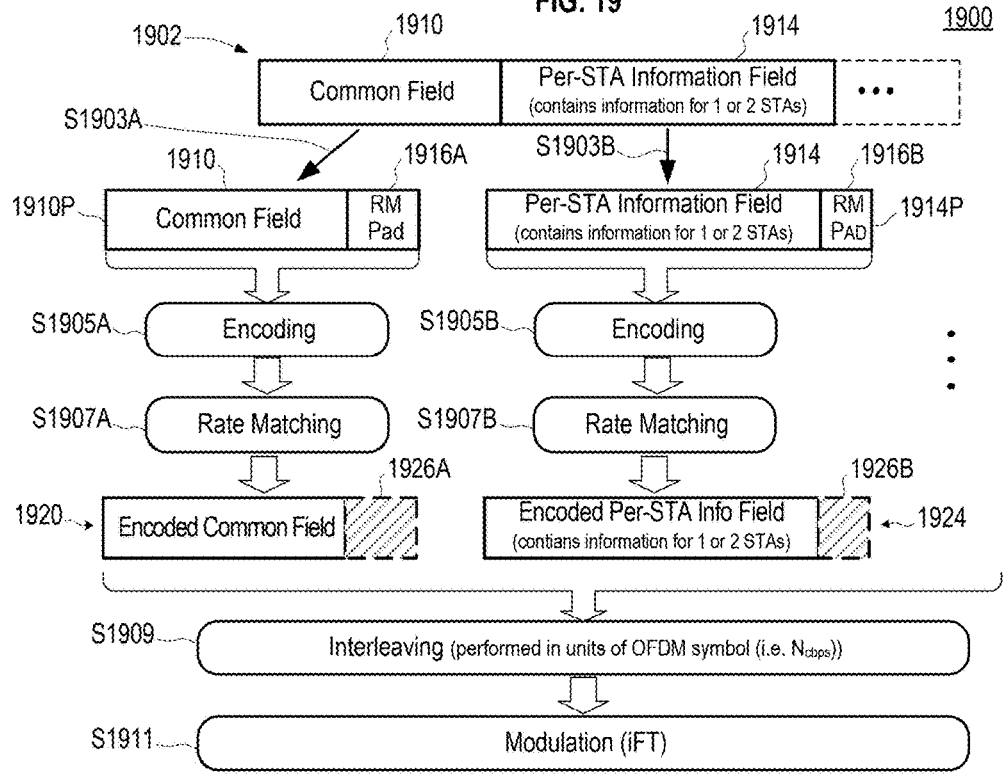
FIG. 19 illustrates a process for encoding and rate-matching an HE-SIG-B field using rate-matching based padding, according to another embodiment.

FIG. 19 illustrates a process 1900 for encoding and rate-matching a HE-SIG-B field 1902, according to another embodiment. Reference characters in FIG. 19 refer to the same features as like-numbered reference characters in FIG. 16; for example, 1602 in FIG. 16 and 1902 in FIG. 19 both refer to an HE-SIG-B field, S1605A and S1905A both refer to an encoding of a padded common field, and so on.

The process 1900 of FIG. 19 differs from the process 1600 of FIG. 16 in that the encoded and rate matched padding bits 1926A and 1926B, respectively corresponding to the padding bits 1916A and padding bits 1916B, are removed from the outputs 1920 and 1924 of the rate matching processes 1907A and 1907B, respectively, before the outputs 1920 and 1924 are concatenated and interleaved at S1909.

In an embodiment of the process 1900, the padding bits 1916A and 1916B are respectively appended to the outputs of the encoding process at S1905A and S1905B, instead of to the inputs of the encoding process at S1905A and S1905B as is shown in FIG. 19.

The removal of the output bits corresponding to the filler bits 1916A and 1916B prior to interleaving and modulation reduces the overhead incurred by the filler bits 1916A and 1916B, but maintains the same puncturing pattern for each of a common field 1910 and one or more per-STA information fields 1914, that is, for each information field corresponding to a BCC block in the HE-SIG-B field 1902.

As in the process 1600, the puncturing pattern used in the process 1900 is not dependent of the respective locations of the common field 1910 and or the per-STA information fields 1914 within the HE-SIG-B field 1602. Accordingly, each of the common field 1910 and the one or more per-STA information fields 1914 will be rate-matched using an identical puncturing pattern and are each boundary aligned with rate-matching units of the transmission.

Figure 20:
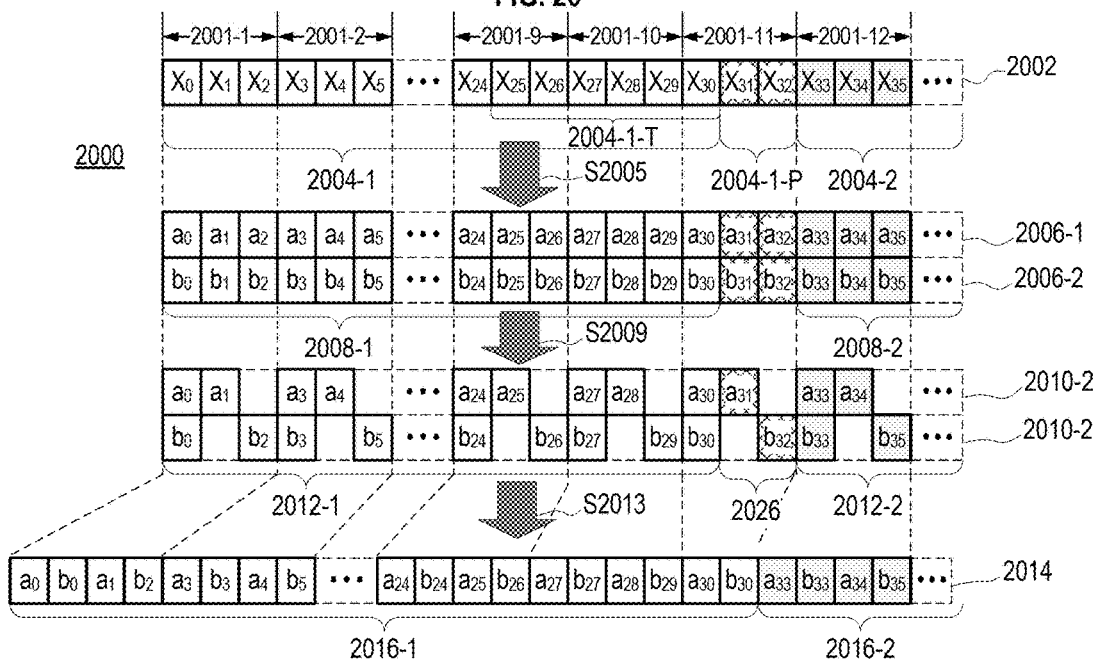
FIG. 20 further illustrates the operation of the process of FIG. 19, according to an embodiment.

FIG. 20 illustrates a process 2000 for BCC rate-matching of a portion of an HE-SIG-B field 2002, according to the embodiment of FIG. 19. The processor may be performed by a device in a WLAN performing a transmission, such as an AP. In FIG. 20, the code-rate is 3/4, and the rate-matching unit is therefore 3 bits, but embodiments are not limited thereto.

Reference characters in FIG. 20 refer to the same features as like-numbered reference characters in FIG. 17; for example, 1702 in FIGS. 16 and 2002 in FIG. 20 both refer to an HE-SIG-B field, S1705A and S2005A both refer to an encoding of a padded common field, and so on.

The process 2000 of FIG. 20 differs from the process 1700 of FIG. 17 in that the encoded and rate matched padding bits 2026, corresponding to the padding bits 2004-1-P, are removed from the first and second punctured encoded bits 2010-1 and 2010-2 before the first and second punctured encoded bits 2010-1 and 2010-2 are combined at S2013 to form a punctured encoded bit stream 2014. The punctured encoded bit stream 2014 includes a first portion 2016-1 corresponding to the first field 2004-1, and a second portion 2016-2 corresponding to the second field 2004-2.

Figure 21:
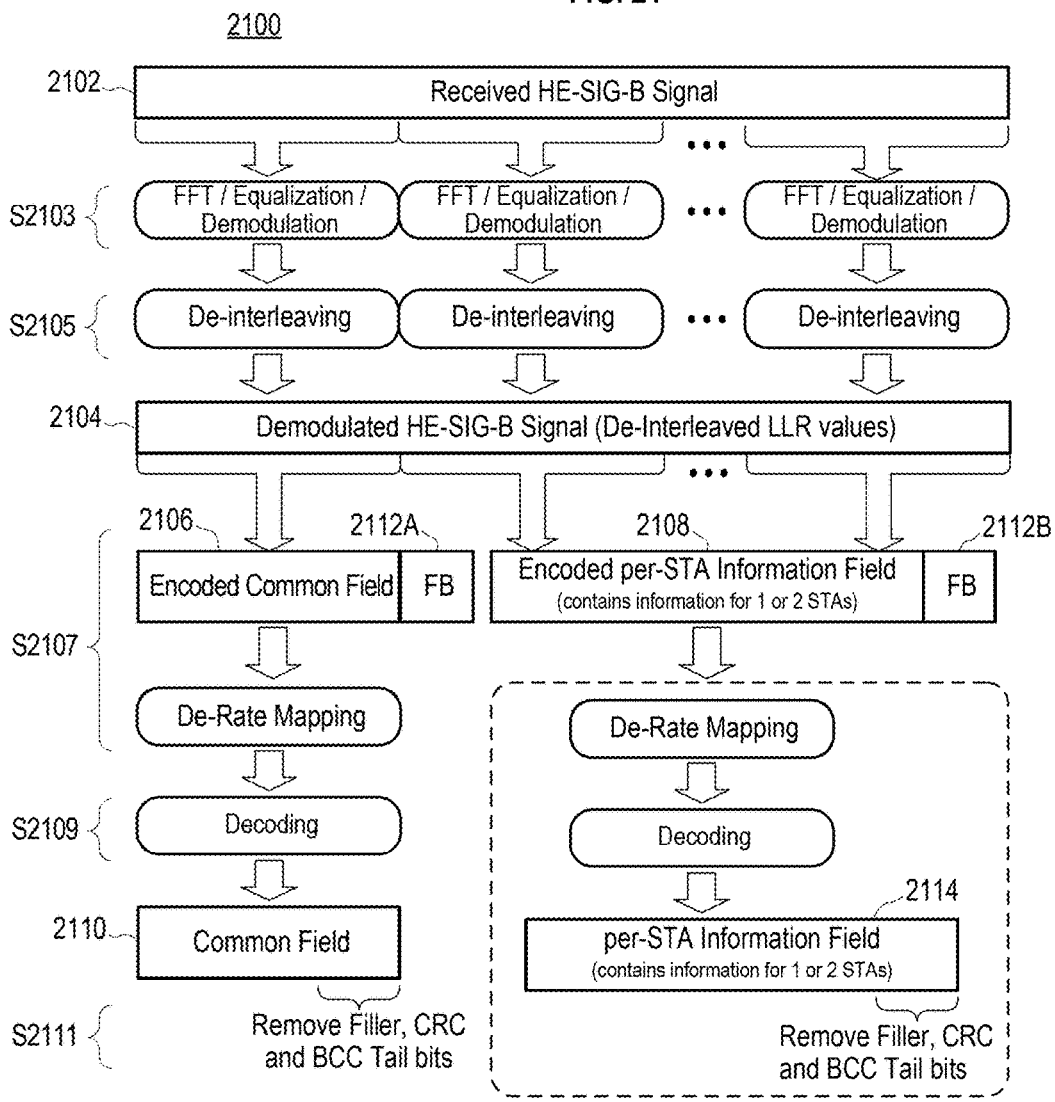
FIG. 21 illustrates a process for de-rate-matching and decoding a signal encoded and rate-matched using the process of FIG. 19, according to an embodiment.

FIG. 21 illustrates a process 2100 for decoding a received HE-SIG-B signal 2102, according to an embodiment. The process 2100 is suitable for use by a wireless device to decode a transmission performed according to the process 1900 of FIG. 19.

As S2103, the received HE-SIG-B signal 2102 is demodulated and equalized. The equalization may include phase tracking and compensation. The demodulation may output signals in the form of log-likelihood ratio (LLR) values.

At S2105, the demodulated and equalized received HE-SIG-B signal is de-interleaved in units of OFDM signals to generate a demodulated received HE-SIG-B signal 2104. When the demodulation of S2103 outputs signals in the form of LLR values, the LLR values are de-interleaved in units of OFDM symbols to generate a demodulated received HE-SIG-B signal 2104. The demodulated received HE-SIG-B signal 2104 is sent for de-rate mapping at S2107.

At S2107, the demodulated received HE-SIG-B signal 2104 (in one embodiment, the De-Interleaved LLR values) are divided into blocks, and padding bits (or fill bits) 2212A, 2212B, and so on are added to make a length of each block equal to an integer multiple of the rate-matching unit, if necessary. Each padded block is then de-rate-mapped. De-rate mapping includes inserting dummy bits to replace bits discarded during a rate mapping performed at, for example, S1907A or S1907B of FIG. 19. The ordering of the values of the demodulated received HE-SIG-B signal 1804 and the dummy bits is determined by the puncturing pattern used during the rate mapping.

At S2109, the de-rate-mapped BCC blocks are each decoded to produce a common field 2110 and one or more per-STA information fields 2114. A Viterbi algorithm may be used to perform the decoding.

At S2111, the CRC, BCC tail bits, and any padding added at S2107 are removed from the common field 2110 and the one or more per-STA information fields 2114.

In an embodiment, some fields within an HE-SIG-B field may be encoded according to the process 1600 of FIG. 16, and other fields within the HE-SIG-B field may be encoded according to the process 1900 of FIG. 19. For example, in an embodiment, a common info field and all but a last of per-STA information field of the HE-SIG-B field are encoded according to the process 1900, and the last per-STA information field of the HE-SIG-B field is encoded using the process 1600.

When HE-SIG-B channels are repeated in frequency, such as in 80 MHz or 160 MHz transmissions, the repeated received HE-SIG-B signals may be thrown away in the receiver or may be combined in the LLR domain, prior to decoding, for a maximum ratio combining effect, resulting in higher decoding performance.

Figure 22A:
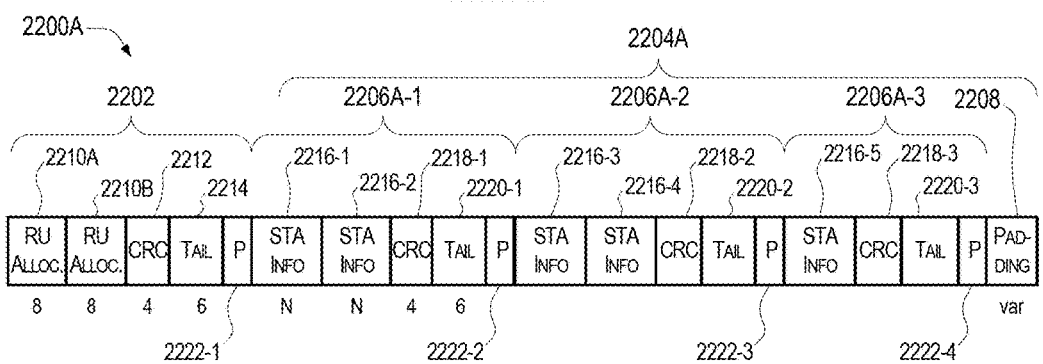
FIG. 22A illustrates an HE-SIG-B field including filler bits for rate-matching unit alignment, according to a first embodiment.

FIG. 22A illustrates an HE-SIG-B field 2200A including filler bits for rate-matching unit alignment, according to a first embodiment. The HE-SIG-B field 2200A includes a common field 2202 and a user-specific information field 2204A. The user-specific information field 2204A includes one or more per-STA information fields (in the example shown, first, second, and third per-STA information fields 2206A-1, 2206A-2, and 2206A-3, respectively) and padding 2208. The padding 2208 is used to make the HE-SIG-B field 2200A occupy a whole number of OFDM symbols.

Each of the per-STA information fields 2206A-1, 2206A-2, and 2206A-3 includes control information for up to 2 stations: the first per-STA information field 2206A-1 includes first and second STA informations 2216-1 and 2216-2, the second per-STA information field 2206A-2 includes third and fourth STA informations 2216-3 and 2216-4, and the third per-STA information field 2206A-3 includes fifth STA information 2216-5.

The first to fifth STA informations 2216-1 to 2216-5 include control information for first to fifth stations, respectively.

The first to third per-STA information fields 2206A-1, 2206A-2, and 2206A-3 further include first to third CRC fields 2218-1 to 2218-3 and first to third tail bits 2220-1 to 2220-3.

The common field 2202 includes resource allocation (RU) signaling for various bandwidths and can contain up to 4 RU allocation subfields. The example of FIG. 22 shows an HE-SIG-B field that is one of two HE-SIG-B fields in an 80 MHz PPDU, and as a result the common field 2202 includes first and second RU allocation fields 2210A and 2210B, which respectively include RU allocation information for first and second 20 MHz bandwidths of the 80 MHz PPDU. The common field 2202 further includes a CRC field 2212 and tail bits 2214.

Each of the common field 2202 and the per-STA information fields 2206A-1, 2206A-2, and 2206A-3 are BCC blocks. Each of the common field 2202 and the per-STA information fields 2206A-1, 2206A-2, and 2206A-3 includes rate-matching filler bits 2222-1, 2222-2, 2222-3, and 2222-4, respectively, that include sufficient bits to make the length of the respective BCC blocks an integer multiple of the rate-matching unit for the MCS being used to encode the HE-SIG-B field 2200A. If one or more of the common field 2202 and the per-STA information fields 2206A-1, 2206A-2, and 2206A-3 have a length that is an integer multiple of the rate-matching unit without padding, the respective padding bits may be omitted.

In the embodiment of FIG. 22A, the rate-matching filler bits 2222-1, 2222-2, 2222-3, and 2222-4 are inserted after the tail bits of the respective BCC blocks, that is, the rate-matching filler bits 2222-1, 2222-2, 2222-3, and 2222-4 are appended, if necessary, to the ends of the BCC block.

The values of the bits of the rate-matching filler bits 2222-1, 2222-2, 2222-3, and 2222-4 can be 0, which aids the BCC encoder in maintaining an all-zero zero state at the end of the BCC block.

Figure 22B:
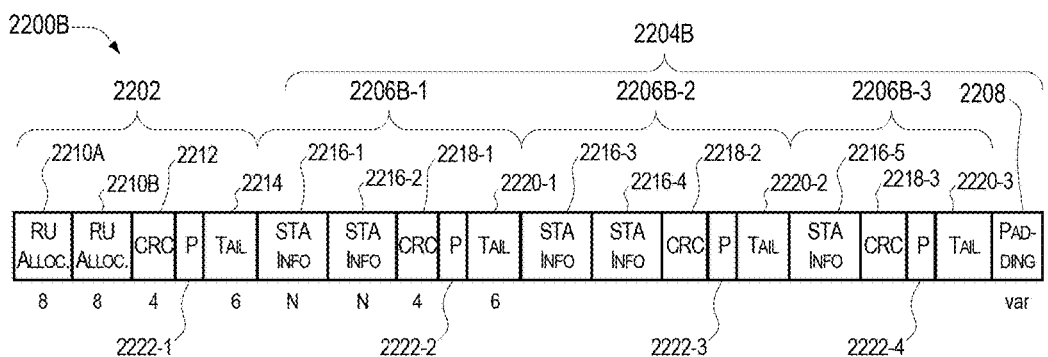
FIG. 22B illustrates an HE-SIG-B field including filler bits for rate-matching unit alignment, according to a second embodiment.

FIG. 22B illustrates an HE-SIG-B field 2200B including filler bits for rate-matching unit alignment, according to a second embodiment. The HE-SIG-B field 2200B differs from the HE-SIG-B field 2200B of FIG. 22A in the location of the rate-matching filler bits 2222-1, 2222-2, 2222-3, and 2222-4.

In the HE-SIG-B field 2200B, the rate-matching filler bits 2222-1, 2222-2, 2222-3, and 2222-4 are inserted between the CRC-field and Tail bit fields of the BCC blocks. In the common field 2202, the rate-matching filler bits 2222-1 is inserted between the CRC field 2212 and tail bits 2214. In the per-STA information fields 2206A-1, 2206A-2, and 2206A-3, the rate-matching filler bits 2222-2, 2222-3, and 2222-4 are inserted between the CRC fields 2218-1, 2218-2, and 2218-3 and the tail bits 2220-1, 2220-2, and 2220-3, respectively. The values of the rate-matching filler bits can be 0.

In another embodiment, the rate-matching filler bits may be added to the front of the information field or between the content of the information field and the CRC/Tail bits. In such an embodiment, the values of the filler bit can be set to 1 or 0. In an embodiment, the rate-matching filler bits are set to 1 in order to generate more randomized signals after BCC encoding of the information fields.

In an embodiment, the rate-matching filler bits vary as a function of an MCS used to transmit an HE-SIG-B field. The MCS of the HE-SIG-B field may be signaled in an HE SIG-A field. For example, in MCS 0, 1, and 3, (which uses 1/2 code-rate), no rate matching filler bits are required. For MCS 2, 4, 6, and 8 (which uses 3/4 code-rate), the common and per-STA information fields should have rate-matching filler bits inserted, when necessary, to make that their lengths each divisible by 3 (e.g. 0, 1, or 2 filler bits per field). For MCS 5 (which uses 2/3 code-rate), the common and per-STA information field should have rate-matching filler bits inserted so that their lengths are each divisible by 2 (e.g. 0 or 1 filler bit per field). For MCS 7 and 9 (which uses 5/6 code-rate), the common and per-STA information field should have rate-matching filler bits inserted so that their lengths are each divisible by 5 (e.g. 0, 1, 2, 3, or 4 filler bits per field).

In another embodiment, the filler bits can be design to be included in each common field such that it supports rate-matching unit boundary alignment of the information fields for all supported MCS of the HE-SIG-B field.

For example, if the HE-SIG-B field supports MCS indexes of 0 to 6, which together use one of code-rates 1/2, 2/3, and 3/4, then when each of a common field and one or more per-STA information fields of the HE-SIG-B field has a length that is an integer multiple of 6 bits (the least common multiple of 1, 2, and 3), the common field and one or more per-STA information fields will each be an integer number of rate-matching units long for any of the supported MCS. From zero to five rate-matching filler bits may inserted such that each common field and per-STA information field are an integer multiple of 6 bits long.

In another example, if the HE-SIG-B field supports MCS indexes of 0 to 9, when the common field and per-STA information fields have a length that is an integer multiple of 30 bits (least common multiple of 1, 2, 3, 5), the common field and one or more per-STA information fields will each be an integer number of rate-matching units long for any of the supported MCS. From 0 to 29 rate-matching filler bits are inserted such that each common field and per-STA information field are an integer multiple of 30 bits long.

Table 2 of FIG. 8 shows the number of data subcarriers per OFDM symbol, $N_{SD}$, number of encoded bits per OFDM symbol, $N_{CBPS}$, and number of payload bits (prior to encoding) per OFDM symbol, $N_{DBPS}$, for each configured MCS of an HE-SIG-B field. $N_{RM}$ denote the rate-matching unit for each MCS. Based on the information in Table 2, an equation can be derived for computing the number of filler bits for the common information field and each per-STA information field, and the number of padding bits to append to the HE-SIG-B field contents.

Let $N_{common}$ be the number of bits for the common information field (excluding Filler, CRC, and Tail bits). Let $N_{STA-SPECIFIC}$ be the number of bits for a single per-STA information field. A per-STA information field consists of 1 or 2 station informations, filler, (possibly CRC), and BCC tail bits. Let $N_{TAIL}$ be the number of tail bits for BCC, which is fixed at 6 bits. Let $N_{CRC1}$ and $N_{CRC2}$ be the number of CRC bits for the common field and per-STA information fields, respectively. Note that if that CRC and STA-ID of a per-STA information field are exclusive-or'd together, as described in some embodiments above, $N_{CRC2}$ may be zero, because there may not be any explicit CRC bits added to the per-STA information fields. Let $N_{STA,1}$ and $N_{STA,2}$ be the number of per-STA information that needs to be conveyed in HE-SIG-B channels 1 and 2, respectively.

For the embodiment illustrated in FIGS. 16-18, a number of filler bits for a common field $N_{FILL-COMMON}$, a first number of filler bits $N_{FILL1}$ for per-STA information fields having one station information, and a second number of filler bits $N_{FILL2}$ for per-STA information fields having two station informations may be computed as follows:

$$N_{FILL-COMMON}=(N_{COMMON}+N_{CRC1}+N_{TAIL}) \bmod N_{RM} \quad \text{Equation 2}$$

$$N_{FILL2}=(2 \cdot N_{STA-SPECIFIC}+N_{CRC2}+N_{TAIL}) \bmod N_{RM} \quad \text{Equation 3}$$

$$N_{FILL1}=(N_{STA-SPECIFIC}+N_{CRC2}+N_{TAIL}) \bmod N_{RM} \quad \text{Equation 4}$$

Then a number of HE-SIG-B field contents, $N_{SIGB,k}$, for each of HE-SIG-B channels 1 and 2, is computed for each HE-SIG-B channel k, k=1 to 2:

$$N_{SIGB,k} = (N_{COMMON} + N_{CRC1} + N_{TAIL} + N_{FILL-COMMON}) + \quad \text{Equation 5}$$
$$\left\lfloor \frac{N_{STA,k}}{2} \right\rfloor \cdot (2 \cdot N_{STA-SPECIFIC} + N_{CRC2} + N_{TAIL} + N_{FILL2}) +$$
$$(N_{STA,k} \bmod 2) \cdot (N_{STA-SPECIFIC} + N_{CRC2} + N_{TAIL} + N_{FILL1})$$

Then the required number of OFDM symbols, $N_{SYM,k}$, for each HE-SIG-B channel, is computed for each HE-SIG-B channel k, k=1 to 2:

$$N_{SYM,k} = \left\lceil \frac{N_{SIGB,k}}{N_{DBPS}} \right\rceil \quad \text{Equation 6}$$

The HE-SIG-B channels must have the same number of OFDM symbols, therefore the final HE-SIG-B number of symbols, $N_{SYM}$, is the maximum of the two:

$$N_{SYM}=\max(N_{SYM,1},N_{SYM,2}) \quad \text{Equation 7}$$

Finally, a number of padding bits, $N_{PAD,k}$, for each HE-SIG-B channel k, k=1 to 2, can be computed by:

$$N_{PAD,k}=N_{DBPS} \cdot N_{SYM}-N_{SIGB,k} \quad \text{Equation 8}$$

For the embodiment illustrated in FIGS. 19-21, a number of filler bits for a common field $N_{FILL-COMMON}$, a first number of filler bits $N_{FILL1}$ for per-STA information fields having one station information, and a second number of filler bits $N_{FILL2}$ for per-STA information fields having two station informations may be computed using Equations 2, 4, and 3, respectively, above.

The number of encoded HE-SIG-B field contents, $\hat{N}_{SIGB,k}$, for each HE-SIG-B channel k, k=1 to 2, is computed:

$$\hat{N}_{SIGB,k} = \left\lceil \frac{N_{COMMON} + N_{CRC1} + N_{TAIL}}{R} \right\rceil + \quad \text{Equation 9}$$
$$\left\lfloor \frac{N_{STA,k}}{2} \right\rfloor \cdot \left\lceil \frac{2 \cdot N_{STA-SPECIFIC} + N_{CRC2} + N_{TAIL}}{R} \right\rceil +$$
$$(N_{STA,k} \bmod 2) \cdot \left\lceil \frac{N_{STA-SPECIFIC} + N_{CRC2} + N_{TAIL}}{R} \right\rceil$$

Next the required number of OFDM symbols, $N_{SYM,k}$, for each HE-SIG-B channel k, k=1 to 2, are computed:

$$N_{SYM,k} = \left\lceil \frac{\hat{N}_{SIGB,k}}{N_{CBPS}} \right\rceil \text{ for } k = 1, 2 \quad \text{Equation 10}$$

The HE-SIG-B channels 1 and 2 must have the same number of OFDM symbols, therefore the final HE-SIG-B number of symbols, $N_{SYM}$, is the maximum of the two:

$$N_{SYM}=\max(N_{SYM,1},N_{SYM,2}) \quad \text{Equation 11}$$

In a first embodiment, wherein the padding bits are added prior to encoding, the number of padding bits, $N_{PAD,k}$, for each HE-SIG-B channel can be computed by:

$$N_{PAD,k}=\lfloor (N_{CBPS} \cdot N_{SYM}-\hat{N}_{SIGB,k}) \cdot R \rfloor \text{ for } k=1,2 \quad \text{Equation 12}$$

In a second embodiment, wherein padding bits are added after encoding (option 1 computes the padding bits prior to encoding), the number of padding bits, $\tilde{N}_{PAD,k}$, for each HE-SIG-B channel can be computed by:

$$\tilde{N}_{PAD,k}=N_{CBPS} \cdot N_{SYM}-\hat{N}_{SIGB,k} \text{ for } k=1,2 \quad \text{Equation 13}$$

Embodiments can reduce the HE-SIG-B field signaling overhead and enable a receiver to perform decoding, and in particular BCC rate-de-matching, efficiently.

The solutions provided herein have been described with reference to a wireless LAN system; however, it should be understood that these solutions are also applicable to other network environments, such as cellular telecommunication networks, wired networks, etc.

The above explanation and figures are applied to an HE station, an HE frame, an HE PPDU, an HE-SIG field and the like of the IEEE 802.11ax amendment, but they can also applied to a receiver, a frame, PPDU, a SIG field, and the like of another future amendment of IEEE 802.11.

Embodiments of the present disclosure include electronic devices configured to perform one or more of the operations described herein. However, embodiments are not limited thereto.

Embodiments of the present disclosure may further include systems configured to operate using the processes described herein. The systems may include basic service sets (BSSs) such as the BSSs 100 of FIG. 1, but embodiments are not limited thereto.

Embodiments of the present disclosure may be implemented in the form of program instructions executable through various computer means, such as a processor or microcontroller, and recorded in a non-transitory computer-readable medium. The non-transitory computer-readable medium may include one or more of program instructions, data files, data structures, and the like. The program instructions may be adapted to execute the processes and to generate and decode the frames described herein when executed on a device such as the wireless devices shown in FIG. 1.

In an embodiment, the non-transitory computer-readable medium may include a read only memory (ROM), a random access memory (RAM), or a flash memory. In an embodiment, the non-transitory computer-readable medium may include a magnetic, optical, or magneto-optical disc such as a hard disk drive, a floppy disc, a CD-ROM, and the like.

In some cases, an embodiment of the invention may be an apparatus (e.g., an AP station, a non-AP station, or another network or computing device) that includes one or more hardware and software logic structure for performing one or more of the operations described herein. For example, as described above, the apparatus may include a memory unit, which stores instructions that may be executed by a hardware processor installed in the apparatus. The apparatus may also include one or more other hardware or software elements, including a network interface, a display device, etc.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined.

What is claimed is:

1. A wireless device for transmitting a frame, comprising:
one or more memories; and
one or more processors coupled to the one or more memories, the one or more processors configured to cause:
Block Convolution Code (BCC) encoding of bits of a BCC block to generate rate-matched bits of the BCC block according to a puncturing pattern;
generating a frame including a High Efficiency Signal B (HE-SIG-B) field, the HE SIG B field including the rate-matched bits of the BCC block; and
transmitting the frame,
wherein the puncturing pattern depends on a total number N of bits of the HE-SIG-B field that precede the BCC block, the total number N being greater than 0.

2. The wireless device of claim 1, wherein the rate-matched bits of the BCC block has a code-rate of K/M, K and M being positive integers greater than zero, so that K bits of the BCC block are encoded into M rate-matched bits of the BCC block, and
wherein the puncturing pattern depends on a remainder Z, the remainder Z being equal to the total number N modulo K.

3. The wireless device of claim 2, wherein the puncturing pattern corresponds to a basic puncturing pattern for the code-rate K/M left cyclic-shifted by the remainder Z.

4. The wireless device of claim 3, wherein BCC encoding the bits of the BCC block includes:
generating a first set of encoded bits using a first polynomial, and
generating a second set of encoded bits using a second polynomial.

5. The wireless device of claim 4, wherein the code-rate is 3/4, wherein the first set of encoded bits includes a first plurality of consecutive three-bit sequences beginning at an earliest bit of the first set of encoded bits, wherein the second set of encoded bits includes a second plurality of consecutive three-bit sequences beginning at an earliest bit of the second set of encoded bits, and wherein BCC encoding the bits of the BCC block includes:
discarding a third bit of each of the first plurality of consecutive three-bit sequences and a second bit of each of the second plurality of consecutive three-bit sequences when the remainder Z is equal to zero;
discarding a second bit of each of the first plurality of consecutive three-bit sequences and a first bit of each of the second plurality of consecutive three-bit sequences when the remainder Z is equal to one; and
discarding a first bit of each of the first plurality of consecutive three-bit sequences and a third bit of each of the second plurality of consecutive three-bit sequences when the remainder Z is equal to two.

6. The wireless device of claim 4, wherein the code-rate is 2/3, wherein the second set of encoded bits includes a plurality of consecutive two-bit sequences beginning at an earliest bit of the second set of encoded bits, and wherein BCC encoding the bits of the BCC block includes:
discarding a second bit of each of the plurality of consecutive two-bit sequences when the remainder Z is equal to zero; and
discarding a first bit of each of the plurality of consecutive two-bit sequences when the remainder Z is equal to one.

7. The wireless device of claim 1, wherein the HE-SIG-B field includes a plurality of BCC blocks, and further comprising:
BCC encoding whole bits of the plurality of BCC blocks of the HE-SIG-B field as a single codeword.

8. The wireless device of claim 1, wherein the HE-SIG-B field includes a plurality of BCC blocks, wherein a plurality of total numbers N are respective total numbers of bits of the HE-SIG-B field that respectively precede the respective BCC blocks of the plurality of BCC blocks; and further comprising:
separately BCC-encoding of bits of the respective BCC blocks using respective puncturing patterns determined using the respective total numbers N.

9. The wireless device of claim 1, wherein the BCC block corresponds to a per-station (per-STA) information field, the per-STA information field including information for one or two stations.

10. A wireless device for receiving a frame, comprising:
one or more memories; and
one or more processors coupled to the one or more memories, the one or more processors configured to cause:
receiving a frame including a High Efficiency Signal B (HE-SIG-B) field, the HE SIG B field including rate-matched bits of a Block Convolution Code (BCC) block; and
BCC decoding the rate-matched bits of the BCC block according to a puncturing pattern, wherein the puncturing pattern depends on a total number N of bits of the HE-SIG-B field that precede the BCC block, the total number N being greater than 0.

11. The wireless device of claim 10, wherein the rate-matched BCC block has a code-rate of K/M, K and M being positive integers greater than zero, so that K bits of the BCC block are encoded into M rate-matched bits of the BCC block, and wherein the puncturing pattern depends on a remainder Z, the remainder Z being equal to the total number N modulo K.

12. The wireless device of claim 11, wherein the puncturing pattern corresponds to a basic puncturing pattern for the code-rate K/M left cyclic-shifted by the remainder Z.

13. The wireless device of claim 12, wherein the code-rate is 3/4, and wherein BCC decoding the rate-matched bits of the BCC block includes:

for each of a plurality of consecutive four-value sequences {x1, x2, x3, x4} in the rate-matched bits of the BCC block:

generating a first three-value sequence {x1, x3, D} and a second three-value sequence {x2, D, x4} when the remainder Z is equal to zero;

generating the first three-value sequence {x1, D, x3} and the second three-value sequence {D, x2, x4} when the remainder Z is equal to one; and generating the first three-value sequence {D, x2, x4} and the second three-value sequence {x1, x3, D} when the remainder Z is equal to two, wherein the plurality of consecutive four-value sequences begins at an earliest value of the rate-matched bits of the BCC block, and wherein D is a predetermined dummy value.

14. The wireless device of claim 12, wherein the code-rate is 2/3, and wherein BCC decoding the rate-matched bits of the BCC block includes:

for each of a plurality of consecutive three-value sequence {x1, x2, x3} in the rate-matched bits of the BCC block:

generating a first two-value sequence {x1, x3} and a second two-value sequence {x2, D} when the remainder Z is equal to zero; and generating the first two-value sequence {x1, x2} and the second two-value sequence {D, x3} when the remainder Z is equal to one, wherein the plurality of consecutive three-value sequences begins at an earliest value of the rate-matched bits of the BCC block, and wherein D is a predetermined dummy value.

15. The wireless device of claim 10, wherein the HE-SIG-B field includes a plurality of BCC blocks, and further comprising:

BCC decoding whole rate-matched bits of the plurality of BCC blocks as a single codeword.

16. The wireless device of claim 10, wherein the HE-SIG-B field includes a plurality of BCC blocks, wherein a plurality of total numbers N are respective total numbers of bits of the HE-SIG-B field that respectively precede the respective BCC blocks of the plurality of BCC blocks, and further comprising:

separately BCC-decoding rate-matched bits of the respective BCC blocks of the HE-SIG-B field according to respective puncturing patterns determined according to the respective total numbers N.

17. The wireless device of claim 10, wherein the BCC block corresponds to a per-station (per-STA) information field, the per-STA information field including information for one or two stations.

* * * * *